(12) United States Patent
Lowy et al.

(10) Patent No.: US 6,621,302 B2
(45) Date of Patent: Sep. 16, 2003

(54) EFFICIENT SEQUENTIAL CIRCUITS USING CRITICAL RACE CONTROL

(75) Inventors: Menahem Lowy, Merrimack, NH (US); Neal R. Butler, Acton, MA (US); Rosanne Tinkler, Lexington, MA (US)

(73) Assignee: Bae Systems Information and Electronic Systems Integration, Inc, Nashua, NH (US)

( * ) Notice: Subject to any disclaimer, the term of this patent is extended or adjusted under 35 U.S.C. 154(b) by 117 days.

(21) Appl. No.: 09/947,044

(22) Filed: Sep. 5, 2001

(65) Prior Publication Data

US 2002/0175705 A1 Nov. 28, 2002

Related U.S. Application Data

(60) Provisional application No. 60/277,687, filed on Mar. 21, 2001.

(51) Int. Cl.[7] .............................................. H03K 19/00
(52) U.S. Cl. ............................. 326/93; 326/28; 326/46
(58) Field of Search ..................... 326/46, 93–98, 326/26–28

(56) References Cited

U.S. PATENT DOCUMENTS

| | | | |
|---|---|---|---|
| 3,971,960 A | 7/1976 | Means et al. | |
| 4,491,745 A | 1/1985 | Birch | |
| 4,638,183 A * | 1/1987 | Rickard et al. | 327/197 |
| 4,841,168 A | 6/1989 | Kubota | |
| 4,912,348 A | 3/1990 | Maki et al. | |
| 5,028,814 A | 7/1991 | Sung et al. | |
| 5,072,132 A | 12/1991 | Samaras et al. | |
| 5,077,676 A | 12/1991 | Johnson et al. | |
| 5,081,377 A | 1/1992 | Feyman | |
| 5,162,667 A | 11/1992 | Yasui et al. | |
| 5,410,550 A | 4/1995 | Simmons et al. | |
| 5,497,114 A | 3/1996 | Shimozono et al. | |
| 5,532,634 A | 7/1996 | Sato | |
| 5,654,658 A * | 8/1997 | Kubota et al. | 327/202 |
| 5,796,283 A | 8/1998 | Martin | |
| 6,058,156 A | 5/2000 | Kanba | |
| 6,064,232 A * | 5/2000 | Relph | 326/93 |
| 6,097,230 A | 8/2000 | Bareither | |

OTHER PUBLICATIONS

PCT International Search Report dated Jul. 31, 2002 of International Application No. PCT/US02/08960 filed Mar. 20, 2002.

* cited by examiner

Primary Examiner—Don Le
(74) Attorney, Agent, or Firm—Maine & Asmus

(57) ABSTRACT

Methods and apparatus for controlling critical races in sequential circuits so that the there are no conflicts when two or more different data signals exists on shared circuit paths. This enables the design and implementation of sequential circuits having fewer gates than conventional circuit designs of equivalent function that translates into smaller area and power consumption. The control of the critical race is accomplished by adjusting the relative delay of the individual sections of one or more loops.

47 Claims, 19 Drawing Sheets a) S-R Latch using NOR gates. Set and Reset use positive levels at nodes S and R respectively.

b) S-R Latch using NAND gates. Set and Reset use negative levels at nodes S and R respectively.

EFFICIENT SEQUENTIAL CIRCUITS USING CRITICAL RACE CONTROL

CROSS REFERENCE TO RELATED APPLICATIONS

This application claims priority under 35 U.S.C. Section 119 from a U.S. Provisional Patent Application serial No. 60/277,687 filed on Mar. 21, 2001, which is incorporated herein by reference for all purposes.

BACKGROUND OF THE INVENTION

1. Technical Field of the Invention

This present invention relates to integrated circuit design, and more particularly to synchronous and asynchronous sequential logic circuits and controlling critical races therein.

2. Background Art

Sequential logic circuits are heavily used in the implementation of very large scale integrated (VLSI) circuits. They appear as registers, as memory elements, as counters, in pseudo-random code generators and everywhere that data has to be manipulated such as in digital filters, data paths and logic operations. Therefore the improvement of such circuits such as a decrease in silicon area needed for implementation and/or a decrease in power consumption, without impairing other characteristics, is of prime importance to the VLSI industry. The resulting characteristics of the improved circuits would increase fabrication yield and/or increase the number of functions that can be implemented on the die.

Circuit size reduction also benefits conventional circuits that are too large or consume too much power to be efficiently used in VLSI circuits. For example, double edge-triggered D flip-flops (DETDFF) process data at both positive transition (low to high) and negative transition (high to low) of the clock. Compared to positive edge-triggered D flip-flop (PETDFF) which process data only at the positive transition of the clock, the DETDFF doubles the rate of data processing or, alternatively halves the clock rate thereby, either increasing the data throughput or reducing power consumption in the clock circuit respectively. However the implementation of conventional static DETDFF requires many gates and consumes too much silicon area to make them an attractive design alternative in VLSI circuits.

Sequential logic circuits are characterized by their structure that includes one or more feedback loops. The closed feedback loop "latches" or "stores" the present state of the circuit by closing the path returning the value of the circuit to its input. In synchronous sequential circuits, the opening and closing of the loop is controlled by a transition (low to high or high to low) of the clock waveform. The new value appears at the output node after a "propagation delay" due to the elements in the loop, and is held, or "memorized" by the loop until the signal to accept a new value appears.

The flip-flop is the basic synchronous sequential circuit. Flip-flops appear in various configurations or "types", such as D flip-flops, T flip-flops and J-K flip-flops where the D flip-flop is the most common. Flip-flops, of all three types, are usually configured as Master-Slave flip-flops, i.e. a sequential structure using two latches, called master and slave respectively, in cascade. A latch is the simplest sequential circuit containing a single feedback loop for storing one bit of data.

In the case of a positive edge-triggered D flip-flop (PETDFF), a positive clock transition, or positive edge, determines the output of the flip-flop as that value present at its input just before the clock transition. Thus for correct operation the input value has to be maintained to a stable value just before and just after the clock transition.

The correct operation of flip-flops is dependent on the time delays internal to the feedback loops with respect to the external input and clock waveforms. Excessive delay in the feedback loop can result in faulty operation of the flip-flop. In the conventional use of sequential logic circuits, the time delay of feedback loops is usually a small fraction of the periods of input data and of clock waveforms and does not interfere with the correct operation of the circuit. Also in a well-designed sequential circuit, only one value is present at both ends of an open loop before the loop closes. At the appropriate closing time the loop will then latch that value.

However when more than one value is input to a feedback loop, a critical race develops between the conflicting values. The final value latched in the circuit as result of the critical race depends on the internal delay of the loop. The internal delay of a logic circuit loop, although generally small with respect to the periods of data and clock, is not well defined, as this delay is dependent on the parasitic elements in the loop. These parasitic elements are due to the non-linear input and output capacitances of the transistors, capacitive coupling with other elements, interconnection and load capacitances and finite resistance and inductance of wiring and switching transistors when being activated (in the "on" state).

One way to reduce the number of components in a master-slave flip-flop (M/S FF), and therefore reducing the required silicon area needed to implement it, consists of sharing a gate between the master latch and the slave latch. This eliminates one gate and its optional associated reset line. However sharing of the gate results in coupling between the feedback loops of the master and slave latches. This coupling between loops introduces critical races as the final state of the shared loop depends upon the value of which of the two latches will prevail and be the one to be latched. This critical race time interval is relatively small compared to the periods of clock and data, and is dependent upon the parasitic capacitances and resistances present in the coupled loop. The precise values of parasitic capacitances and resistances are unknown as they depend on the fabrication process. Thus, removing gates in the manner just described introduces critical races into the circuit, the final state of which is unknown.

This method, which introduces critical races, is therefore not practical or commercially viable. Accordingly, design practices for sequential logic circuits teach away from using critical race conditions in a circuit as this is assumed to create conditions that would make the circuit fail and/or generate unpredictable outcomes. Therefore present flip-flop configurations include additional circuitry to guarantee the absence of critical race conditions.

An additional way to avoid critical races is to have additional components to delay certain paths or to provide additional latching. However, as discussed herein, additional circuits increase power consumption and circuit area space.

In asynchronous sequential circuits critical races are also a problem, as no clock synchronization is used to close or open the feedback loop. In these circuits, as the feedback loop opens and closes under control of external signals unrelated to each other, more often than not more than one value is available instantaneously in the loop and critical races are often present.

Numerous approaches, such as unusual clocking and circuitry arrangements, have been used to eliminate race conditions and reduce circuit size. One example, U.S. Pat. No. 5,072,132, teaches a means of reducing circuit size by the use of a pulse generator coupled to the clock input of the latch. According to this design, a pulse generator produces sliver pulses correlating to the propagation delay through the latch of the state device circuits and thus purportedly enables a single latch to act as a flip-flop without racing. Alternatively, U.S. Pat. No. 4,841,168 teaches increasing circuit density by reducing gates, while avoiding racing. This is obtained by sharing a data gate between master and slave latches such that a latch gate of the master latch is shared by the slave latch as a data gate. Additionally, the clock signal is altered by changing the signal transmission speed of the clock on the slave side of the gate and adding control signals to the clock driver.

Additional background information on critical races can be found in "Fundamentals of Logic Design", by Charles H. Roth, Jr., West Publishing Company, 1992, Ch. 23, p. 602–603 and Ch. 25, p.629. Operation of a static double edge-triggered flip-flop is detailed in the paper: "High-performance two-phase micropipeline building blocks: double edge triggered latches and burst mode select and toggle circuits" by Yun, K. Y., Beerel, P. A. and Arceo, J. in IEE Proc., Circuits, Devices, Syst., 1996, 143,(5), pp.282–288.

As can be seen, attempts to reduce circuit size have not only been frustrated by the risk of critical races, but the solutions to the problem of critical races generally involves complication of the circuit's clocking arrangement or the addition of other circuitry to enable the device. What is needed therefore, is a method and apparatus for controlling critical races in sequential circuits that facilitates implementation of circuits with fewer gates and on smaller silicon area without the need of adding components or implementing compensatory clocking schemes.

SUMMARY OF THE INVENTION

The invention is devised in the light of the problems of the prior art described herein. Accordingly it is a general object of the present invention to provide a novel and useful technique that can solve the problems described herein.

In addition, the critical race control techniques of the present invention give rise to configurations of sequential integrated circuits with less area and lower power dissipation than conventional implementations. The techniques of the present invention also simplifies the design of asynchronous circuits by solving the problem of critical races.

Critical race control reduces the number of logic gates necessary to implement the circuit by sharing some gates and circuit paths among data latches. This technique achieves a corresponding reduction in required silicon area while controlling the result of critical races thus enabling the circuit to function properly. In addition, the resulting sequential circuits, as disclosed herein, consume less power in some applications.

Methods and apparatus for implementing critical race control in sequential circuits are disclosed herein. Critical race control meets the needs identified herein by adjusting the relative delay of the individual sections of the shared feedback loop with respect to one another through adjustment of the resistance of the transmission gate in each section thereby adjusting the delay of the loop section in which the transmission gate is embedded.

The effect of this regulation is the control of critical races by ensuring that only data from the desired input is allowed to determine a given gate's output when two or more different data exists on a shared circuit paths. This enables the design and implementation of sequential circuits having fewer gates than found in conventional circuit designs of equivalent function.

Critical race control may be used in a wide range of applications, particularly those involving static sequential circuits. As described herein, critical race control may be readily embodied in the commonly used master-slave edge-triggered flip-flop circuits. Examples of embodiments include a D flip-flop, a static shift register and a static double-edged-triggered D flip-flop circuit for applications wherein data and clock rates are equivalent. In addition, an embodiment of an integrated shift right-shift left register with smaller number of gates than the conventional implementation of that function is also included.

Critical race control (CRC) can be successfully applied to facilitate the design of asynchronous circuits by eliminating the concern for critical races, therefore obtaining circuits with a lower number of gates as compared to present implementation methods. An example is presented using CRC for the implementation of an asynchronous circuit containing critical races that cannot be implemented with present methods. These embodiments exemplify the wide range of use and flexibility of this new technique.

The effective delay in a transmission path section, can be changed by altering its time constant through modification of its resistance, and/or its capacitance or by varying the current and voltages charging and discharging the various elements in the path or still, by changing the threshold voltages of the logic gates in the loop. In practice a combination of some or all of the above methods, including varying power supplies, clock rates and other parameters may be used. In VLSI circuits the designer has almost no control on the parasitic capacitances except for the desire to minimize them, therefore it is easier to modify the resistances in the paths. Fortunately, the resistance of the transmission gate can be easily and robustly regulated by adjusting the size of its constituent transistors during design.

In large VLSI dies there are variations in transistors parameters due to the non-uniformity of the VLSI fabrication process over the size of the die. Changes in local environmental and electrical conditions on large dies, such as high local temperature ("hot spots") and local supply voltage variations, will also induce variations in the operating conditions of individual transistors, and therefore on circuits, at different locations on the die. Therefore circuits relying on absolute relations between parameters of transistors for correct operation are not robust and cannot operate over a wide range of environmental and process fabrication parameters. Critical race control, as described herein relies on the ratio of resistance of only two transmission gates that are in very close physical proximity to one another as they are in the same loop of the same flip-flop. Under this condition of close proximity, both the transistor parameters and variations in environmental and electrical conditions will, for all practical purposes, be identical in both transmission gates.

Accordingly by establishing a desired ratio between the resistances of the proximate transmission gates, it is possible to reliably control the delay in various sections of the loop and control the outcome of a critical race.

This technique can be used with all other master/slave implementations. For example, U.S. Pat. No. 5,497,114 describes a master-slave flip-flop that uses single pass transistors to replace the conventional transmission gate used in a flip-flop. The critical race control can be used on that type of flip-flop too to reduce the number of gates.

An object of the invention is a method for producing efficient integrated sequential circuits, comprising the steps of providing at least one data input signal and at least one clock signal, and designing one or more circuit loops each having a plurality of sections and two or more switches wherein the switches in the loops separate between the sections. Another step is controlling a critical race of the loops by adjusting a relative delay of the sections.

An additional object is the method for producing efficient integrated sequential circuits, wherein the switches are one or more transistors and the relative delay is regulated by adjusting transistor dimensions, such as length and width. In another embodiment the relative delay is regulated by adjusting a resistance or capacitance of the transistors. Alternatively, the switches are transmission gates and the relative delay is regulated by adjusting a resistance/ capacitance (RC) time constant of the transmission gates.

A further object is the method for producing efficient integrated sequential circuits, wherein the relative delay is adjustable by external parameters. Although not inclusive, the external parameters include clock frequencies, supply voltages (Vdd), ground supplies (Vss), bias voltages, and temperature. A further embodiment relates to the relative delay that is dynamically controllable by the external parameters. Such dynamic control allows for changing the delay and altering the critical race conditions.

Along this same line, another object is the method for producing efficient integrated sequential circuits, wherein the switches are transmission gates and the relative delay is regulated by adjusting a set of fabrication process parameters directly or indirectly effecting the transmission gates. Such fabrications include doping concentration, implant concentration, threshold voltage, polysilicon dimensions, polysilicon composition, substrate dimensions, diffusion dimensions, metal dimensions and oxide dimensions. The direct effects would be applicable based upon changes to the transmission gates itself, while the indirect effects would effect other logic circuits that are interconnected to the transmission gates.

And an additional object is the method for producing efficient integrated sequential circuits, wherein the switches are transistors and further comprising the step of locating the transistors in close proximity. Such proximity avoids differences in transistors and more certainty when regulating the relative delay.

An object includes the method for producing efficient integrated sequential circuits, wherein the relative delay is a first propagation delay in a first section as compared to a second propagation delay in a second section, wherein the first and second section are within the same loop or coupled loops.

In addition, the method for producing efficient integrated sequential circuits, wherein said relative delay is introduced by resistors within the section. Another object further comprising logic circuits in the sections, and wherein the logic circuits provide the relative delay. Any of the components in the sections can be used to establish the proper relative delay.

And yet another object is the method for producing efficient integrated sequential circuits, wherein integrated circuits are from the group comprising single edge-triggered flip-flops, double edge-triggered flip-flops, D flip-flops, T flip-flops, J-K flip-flops, binary memory elements and S-R flip-flops. Also including efficient integrated sequential circuits, wherein integrated circuits are from the group comprising flip-flops-based registers, shift registers, counters, pseudo random generators, memory devices.

An object also includes the method for producing efficient integrated sequential circuits, wherein a data flow is in more than two directions, such as forward and reverse.

An object of the invention is a sequential circuit comprising a data input, a data output, a loop with a plurality of sections coupled to the data input and the data output. There is a means for controlling a critical race by adjusting a relative time delay between the plurality of sections.

Additionally, the sequential circuit, wherein the means for controlling is changing a ratio of a resistance/capacitance (RC) time constant between the sections. Also, further comprising two or more transmission gates and a plurality of logic devices connected in the loop and wherein the relative time delay is a difference in propagation time delay between the sections of the loop. Accordingly, one of the means for controlling is a ratio of resistance of the sections of the loop. The relative delay is also established where the ratio of resistance is between the transmission gates of the sections. And, wherein the relative delay is between the logic devices of the sections. Furthermore, wherein the relative time difference is changed by adjusting a size of the transmission gates size of capacitance of the sections.

An object of the invention is a sequential circuit comprising a data input, a first loop with a plurality of first loop sections, wherein the first loop is coupled to the data input, and a second loop with a plurality of second loop sections, wherein the second loop is coupled to the first loop. An output node is coupled to the first and second loop such that the output is derived from either loop. There is a means for controlling a critical race between the first loop sections and between the second loop sections by adjusting a relative time delay between the first loop sections and between the second loop sections.

Yet an additional object is the sequential circuit, wherein the means for controlling is changing a ratio of a resistance/ capacitance (RC) time constant between the first loop sections and the second loop sections. The sequential circuit, further comprising two or more transmission gates and a plurality of logic devices connected in the first loop and comprising two or more transmission gates and a plurality of logic devices connected in the second loop, and wherein the relative time delay is a difference in propagation time delay between the sections of the first loop and the sections of the second loop. And, the means for controlling is a ratio of resistance of the sections of the first loop and the sections of the second loop. Or, the ratio of resistance is between the transmission gates of the sections of the first loop and the transmission gates of the sections of the second loop, either individually or coupled loops.

Still other objects and advantages of the present invention will become readily apparent to those skilled in this art from the following detailed description, wherein we have shown and described only a preferred embodiment of the invention, simply by way of illustration of the best mode contemplated by us on carrying out our invention. As will be realized, the invention is capable of other and different embodiments, and its several details are capable of modifications in various obvious respects, all without departing from the invention.

BRIEF DESCRIPTION OF THE DRAWINGS

The present invention will be readily understood by the following detailed description in conjunction with the accompanying drawings, wherein like reference numerals designate like structural elements, and in which:

FIG. 6b illustrates the representative waveforms of the operating characteristics of FIG. 6a.

DESCRIPTION OF THE PREFERRED EMBODIMENT

The methods and embodiments of critical race control disclosed herein enable implementations of sequential circuits with fewer logic gates and functionality equal to that of circuits constructed according to existing methods and configurations. In some applications, reduced power consumption is also obtained.

Critical race control, as disclosed herein, is achieved by increasing the delay of one section of the shared feedback loop with respect to the other section. The time constant is controlled by adjusting the resistance of the constituent transistors in the transmission gate in each section of the feedback loop and adjusting the current charging and discharging capabilities of the logic gates. Increasing the resistance of one transmission gate, and thus the delay of the section in which it is embedded, relative to the other ensures that the final state of the critical race is well defined. Controlling critical race conditions according to the present invention obviates the need for circuits with additional circuitry and special clock waveforms.

Figure 11:
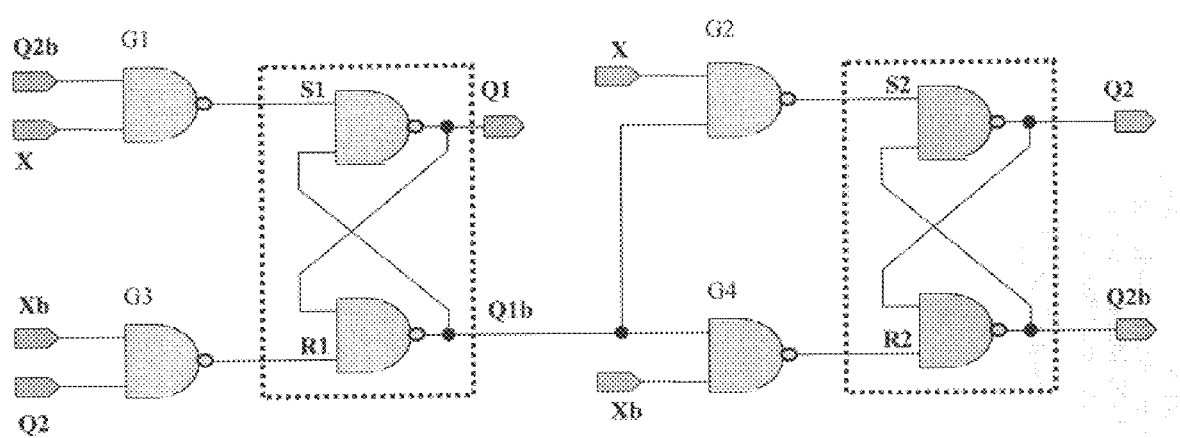
FIG. 11 shows an asynchronous circuit, composed of combinational circuits and S-R latches, that is subject to critical races.
Figure 12:
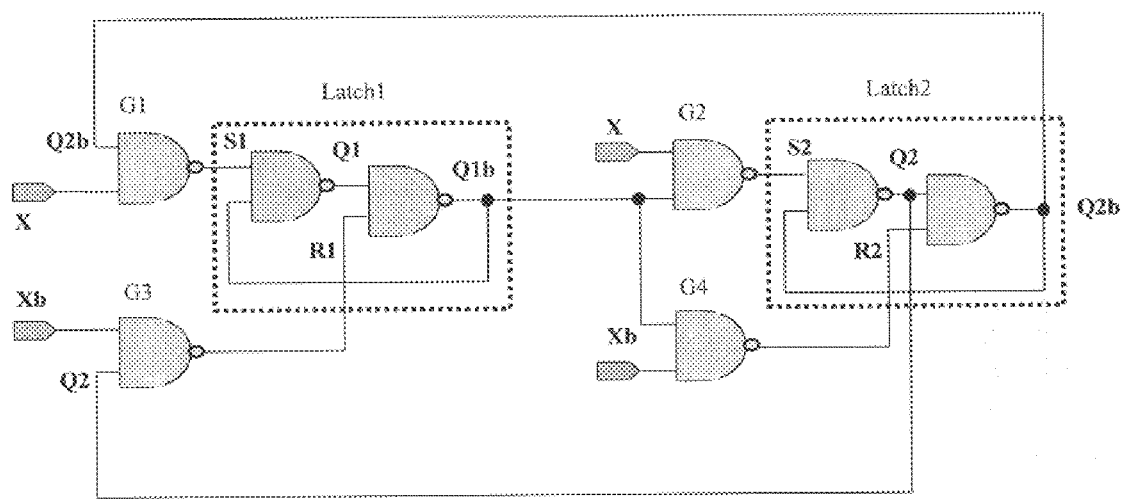
FIG. 12 shows the circuit of FIG. 11 redrawn to reveal the loop stretching from the output of the second S-R latch back to the NAND gate controlling the set node of the first latch. By adjusting the ratio of the delays between the two parts of the circuit formed by each latch and its logic gates controlling the set and reset nodes, it is possible to control the result of the critical races.

One preferred embodiment of critical race control is illustrated by comparing a typical edge-triggered master-slave D flip-flop circuit to a comparable circuit constructed according to critical race control. Other types of flip-flops use similar static sequential circuit architecture with different external gates to obtain different functionality. Accordingly, critical race control may also be applied to T- and J-K master-slave flip-flop circuit designs, because the internal architecture of the sequential circuit is the same. Examples of some other applicable embodiments are disclosed in FIGS. 5a, 6a, 7 and 9 described herein. Critical race control can also be applied to other sequential circuits as well as to asynchronous sequential circuits as shown in FIGS. 11 and 12.

The circuits analyzed and demonstrated in this present invention are static or pseudo-static where the latter indicates that these circuits remain in their state as long as the clocks present adequate voltage levels. From here on both types of circuits will be called static.

Figure 1:
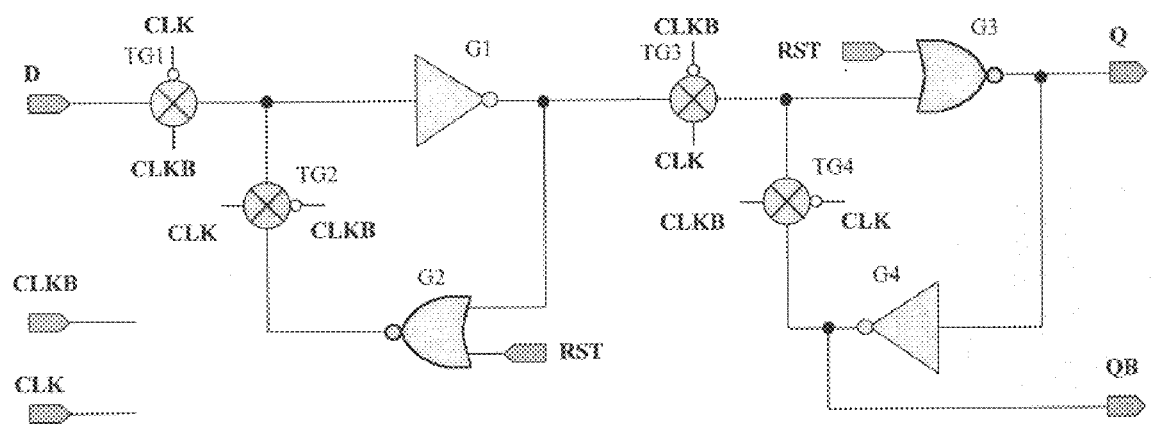
FIG. 1 shows a prior art conventional positive edge-triggered flip-flop with reset in a master-slave configuration.

A typical implementation of a positive edge-triggered master-slave D flip-flop is shown in FIG. 1. The master latch comprises logic gates G1 and G2, and transmission gates TG1 and TG2 while the slave latch comprises logic gates G3 and G4, and transmission gates TG3 and TG4. Gates G1 and G4 are inverters, gates G2 and G3 are NOR gates where one of the inputs to the NOR gate is used to set asynchronously the initial state of the flip-flop.

Transmission gates TG1, TG2, TG3, and TG4 act as switches in series with the signal and are controlled by the amplitude of the clock signal. Each transmission gates consists of a pair of p-type and n-type FET transistors such that the transmission gate toggles between open (on) and closed (off) as a function of a high or low clock signal respectively. When a transmission gate is "open" or "on," it functions similarly to a closed switch and signal passes through it. When a transmission gate is "closed" or "off," it functions similarly to an open switch and signal does not pass through it.

Referring to FIG. 1, when the clock signal (CLK) is low, transmission gates TG1 and TG4 are open and transmission gates TG2 and TG3 are closed. Input data at node D propagates through transmission gates TG1 and logic gates G1 and G2 and is stored on the input capacitors of gates G1 and G2. Note that the input data cannot latch in the master latch due to TG2 being closed. Nor can the data propagate to the slave latch due to TG3 being closed. Accordingly, the present output, $Q_{old}$ is determined by data already latched in the slave latch through G4, TG4, and back through G3.

When the clock signal goes high, transmission gate TG1 closes while transmission gate TG2 opens. The data appearing in the master latch at the input of G1 and G2 is now latched when transmission gate TG2 closes the loop. At the same time, transmission gate TG4 closes opening the slave loop while transmission gate TG3 opens and the data available in the master latch at output of G1 propagates through open transmission gate TG3 to G3's input. The new output, $Q_{new}$, now appears at the output of gate G3.

When the clock signal again goes low, transmission gates TG2 and TG3 close and gates TG1 and TG4 open. G3's output data is latched in the slave loop through G4, TG4, and G3, so output $Q_{new}$ remains the same while the slave latch is disconnected from the master latch by closed transmission gate TG3. Meanwhile, transmission gate TG1 is open, such that G1 and G2 may again receive new data propagating through TG1.

It will be noted that in each loop, whether in the master latch or in the slave latch, there is only one transmission gate that closes or opens the circuit loop for a given clock transition. This is TG2 for the master latch and TG3 for the slave latch. When the transmission gate opens, the data present at the input side and output side of the transmission gate in the loop is the same, due to the two logic inversions in each loop. Thus when the loop is closed, no transient voltages are produced. With a flip-flop designed and operating in this manner, the master and slave latches function discretely from each other to alternately store data in accordance with the clock cycles and the openings and closings of the transmission gates. Thus, as the clock signal rises and falls, each bit of data steps from the master latch to the slave latch with no possibility of conflicting data on any path or at any gate.

Figure 2:
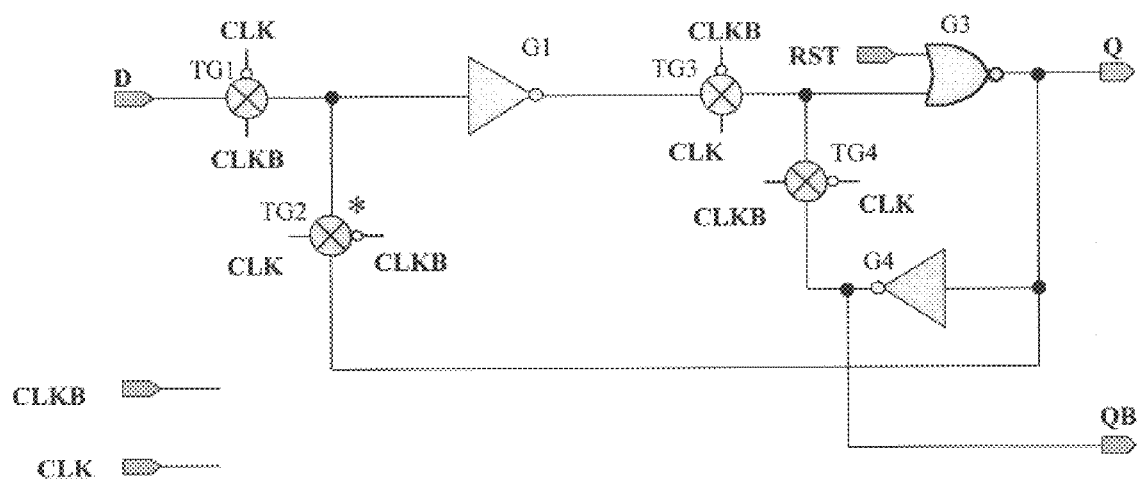
FIG. 2 shows a preferred embodiment of Critical Race Control, wherein a typical positive edge-triggered master-slave D flip-flop has been modified to comprise fewer gates. Control of the critical race condition occurring due to the shared circuit path between latches, is obtained by adjusting the ratio between the resistances of transmission gates TG2 and TG3 through control of the size of their transistors.

FIG. 2 illustrates an embodiment of a positive edge-triggered D flip-flop circuit constructed according to critical race control (CRC). In contrast to the flip-flop circuit shown in FIG. 1, it will be noted that logic gate G2 has been deleted. G3 now performs the inverting function of the deleted gate G2. The master latch in FIG. 2 now comprises TG1, G1, TG3, G3, and TG2. Transmission gate TG2 is marked by a star signifying a longer propagation delay, to distinguish it from transmission gate TG3 as will be explained below. The flip-flop circuit retains the original slave latch TG3, G3, G4, TG4, but the master and slave loops now share gate G3. It should be noted that there are now two switches, TG2 and TG3, in the shared master loop, opening and closing the loop simultaneously. The two switches divide the loop into two distinct sections. This circuit configuration, in which the loop is composed of two sections, introduces conflicting data when the value at input node D differs from the present value at output node Q.

This is because each section of the loop maintains a different value when the loop is open (gates TG2 and TG3 closed, gates TG1 and TG4 open). Under these conditions the data at each terminal of transmission gate TG2 will be different. Similarly the data at each terminal of transmission gate TG3 will also be different as the new data propagating from node D to the output of G1 will differ from the data propagating from node Q to the output of G4 and TG4. This state is stable because transmission gates TG2 and TG3 are presently closed.

However at the moment the loop closes (gates TG2 and TG3 open, gates TG1 and TG4 closed) the presence of two different values at the opposite ends of transmission gates TG2 and TG3 acting as resistances results in an unstable state. This state is unstable because the physical laws force the logic data to be the same at both ends of a conducting transmission gate. Due to this unstable state there will be a brief transient period at the end of which the voltages will reach stable values. These final values depend on a race between which of the values of Q or of D will prevail in the loop. The final state of this race depends on the threshold values of the gates, on the charging and discharging currents and on the parasitic elements in the loop. The value that will be latched in the loop depends therefore on the outcome of that race and is therefore critical.

This is unlike the situation of the circuit in FIG. 1, where the loop in each latch, whether master or slave, is open or closed by only one switch thus ensuring the same values at each end of the loop prior to closing it.

For correct operation of the circuit in FIG. 2, the new value of D must prevail. For this to happen it is necessary that, when gates TG2 and TG3 open, the data appearing at the input node of GI modifies node Q and latches its value in the loop before the old value $Q_{old}$ toggles G1 thereby modifying the input value. This condition can be assured by controlling separately the delays in each section of the shared loop and is the essence of the critical race control invention.

The critical race control invention is readily explained by demonstrating its operation on the typical circuit in FIG. 2. We start at time $t=t_0$ with the circuit in the initial conditions shown in FIG. 3a. D is the input node of transmission gate TG1, $D_{1tch}$ is the output node of TG1 and the input node of inverter G1, and $D_b$ is the output node of G1 and input node of TG3. $G_{3in}$ is the output node of TG3 and the input node of G3. Node Q is G3's output. In this state the clock voltage (not shown) is low, causing transmission gates TG1 and TG4 to be open (on) and transmission gates TG2 and TG3 to be closed (off). The output Q of the flip-flop, is low (0) while complementary output $Q_b$ and node $G_{3in}$ are both high. Note that the state of a flip-flop is different than its output value.

At some time a signal of value VDD is received at input node D. Accordingly, the voltage on node $D_{1tch}$ is $V_{D1tch}=$VDD and the voltage on node $D_b$ is $V_{Db}=0$. As no change in the clock has yet occurred all transmission gates retain their present states, the slave latch loop comprising G3, G4, and TG4 remains latched, and nodes $G_{3in}$ and Q retain their latched values, that is: $VG_{3in}=$VDD and $V_Q=0$. The circuit remains in this state as long as the clock value is low.

Figure 3A:
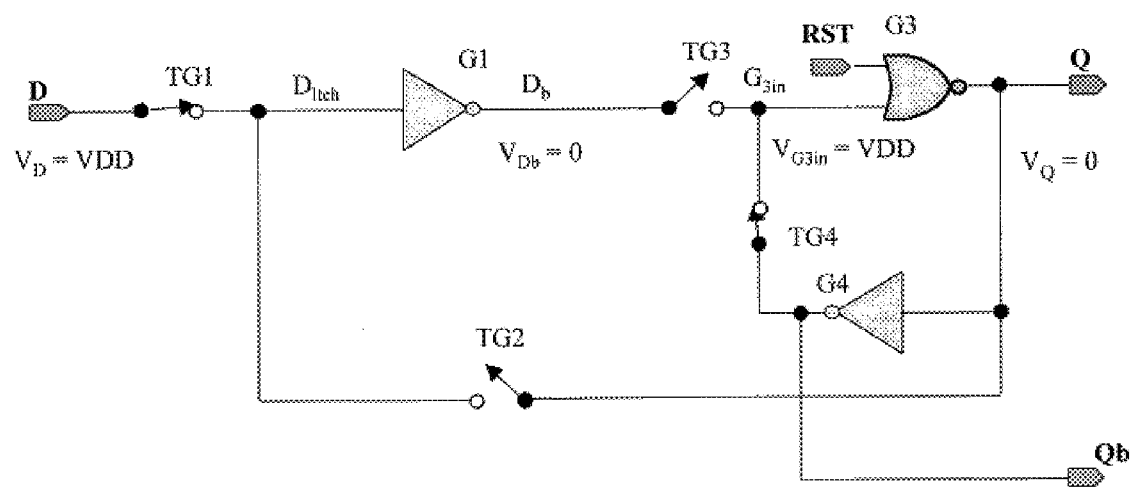
FIG. 3a represents the initial state of the new flip-flop when the current output value is 0 and a new data of value VDD is present at the input.
Figure 3B:
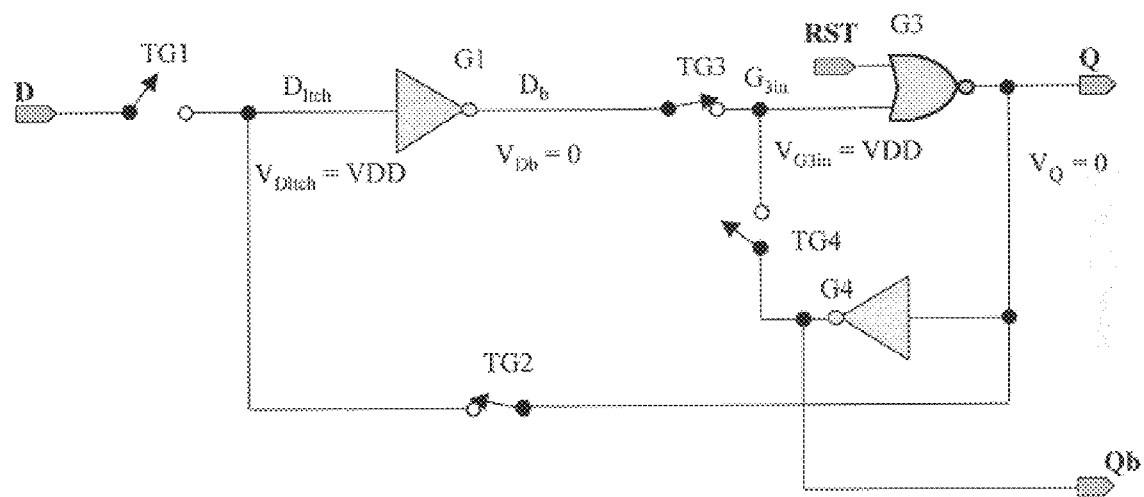
FIG. 3b represents the state of the circuit in FIG. 3a at the time of the clock transition from a low level to a high level.

FIG. 3b shows the state of the circuit at time $t=t_{0+}$, which is the instant the clock signal changes from a low to a high value. This causes the four transmission gates to rapidly switch to their complementary states. Gates TG1 and TG4 are now closed (off), and gates TG2 and TG3 are now open (on). At the instant t=$t_{0+}$, the voltages on the relevant nodes have not yet changed, so transmission gates TG2 and TG3 are now connecting between nodes having different voltages. On the G1 side of TG3, $V_{Db}$=0 while on the G3 side of TG3, $VG_{3in}$=VDD. On the G3 side of TG2, $V_Q$=0 while on the G1 side of TG2, $V_{D1tch}$=VDD. This is an unstable state as the voltages on each side of a transmission gate are required to be of the same digital value. Therefore the voltages in the closed loop are rapidly changing to reach final, stable values.

The closed loop can exist in two stable states. In the first stable state nodes Q and $D_{1tch}$, have a value 0 and nodes $D_b$ and $G_{3i}$ have a value of VDD. In the second stable state nodes Q and $D_{1tch}$, have a value of VDD and nodes $D_b$ and $G_{3in}$ have a value of 0. Which of the two stable states will be the final one is determined by the values of the parasitic elements in each section of the loop. Therefore, a critical race between the two values occurs during the time that the voltages are reaching a stable value.

The description of the technique enabling reliable control of the outcome of the critical races in sequential circuits is one of the subjects of the present invention. By adjusting the propagation delay of one section of the loop in relation to the propagation delay of the other section, it is possible to exercise reliable control over the critical race condition. Specifically, referring to FIG. 3b, transmission gates TG2 and TG3 divide the loop into two sections. The race occurring at the time the transmission gates TG2 and TG3 are closed, that is at time t=$t_{0+}$, is between the value at node $D_b$ and the value at node 0. If the value at node $D_b$ succeeds in changing the value at node Q before the present value of node Q i.e. $Q_{old}$, succeeds in changing the value of node $D_b$, then the circuit will operate correctly. Otherwise the master-slave flip-flop shown in FIG. 2 will retain the old value.

This critical race in the loop is controlled by increasing the propagation delay in the path from node Q to node $D_{1tch}$ as compared to the propagation delay in the path from node $D_b$ to node Q. This ensures that node Q will flip to its new value $Q_{new}$, before the old value $Q_{old}$, will be able to modify the value at node $D_b$. Thus the new value at node Q will always be determined by the incoming new data stored at node $D_{1tch}$.

Control of the propagation delay in a section of the loop can be realized in many ways. Voltage supplies, clock rates and other external parameters, such as temperature (identical loop sections at different temperatures have different propagation delays) can be modified. Internally, the current source and sink capabilities of the logic gates charging and discharging the devices in the appropriate circuit sections, their threshold voltages and their parasitic elements can be adjusted. The propagation delay can also be controlled by modifying the values of the capacitances and/or of the resistances of the devices in that section. From a practical aspect however, control of the time constant of each section of the loop is readily done in CMOS technology by using a circuit design style employing transmission gates and adjusting the resistance of the transmission gates. This is easily and commonly accomplished by modifying the width, W, and the length, L, of the gates of the transistors in the transmission gates. Modifying the values of other parasitic elements, such as capacitances, is more difficult as the capacitances are in parallel to the nodes of interest and cause additional loading which reduce speed and increase power consumption of the circuits.

It is worthwhile to note that critical race control described herein is very robust as it depends on the ratio of the time constants of two separate parts of the same feedback loop, and not on their absolute value. The close proximity of the two parts of the loop minimizes the small but ever-present variations between transistors due to technical limitations of the fabrication processes, such as non-uniformity of the oxide thickness over the die, and variances induced by local environmental effects, such as thermal differences and supply voltages. This technique therefore guarantees that both transistors behave identically over large variations in the operating conditions of the circuit and that it is possible to specify and maintain an established resistance differential between TG3 and TG2 across a wide range of temperature, supply voltage, and fabrication parameters.

Figure 4A:
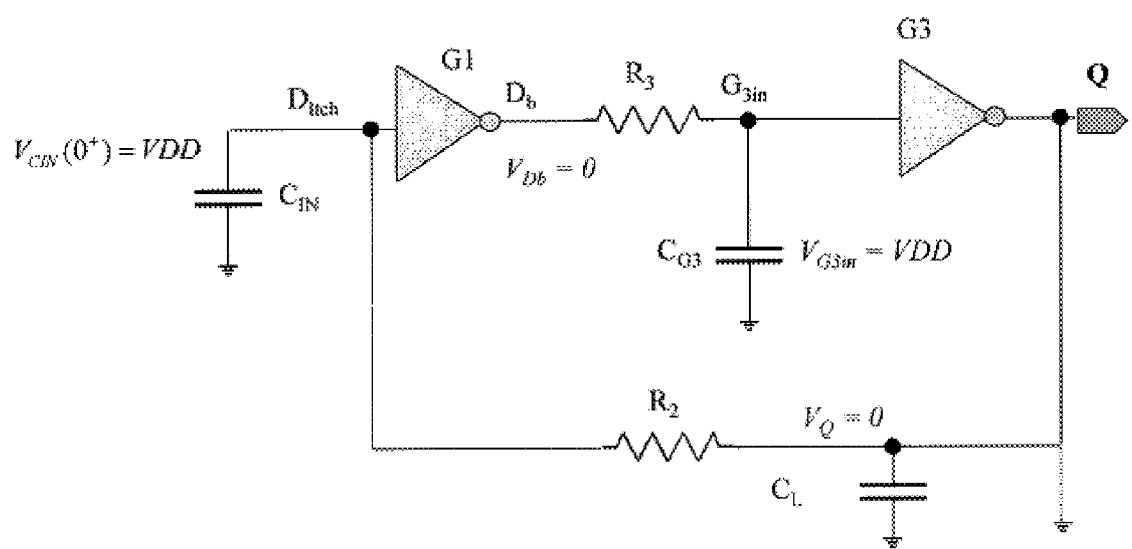
FIG. 4a represents the equivalent electrical circuit of the logic circuit shown in FIG. 3b, including the relevant parasitic elements.

The inventive technique of critical race control requires that the designer take into account the parasitic elements that, through their time constant, decide the critical race outcome. To account for these elements, the circuit in FIG. 3b is redrawn to model its parasitic electrical components, as shown in FIG. 4a. In that figure the non-linear and time-varying parasitic capacitances and transmission gate resistances are characterized by constant parameters. Inverter G3 models the electrical equivalent of NOR gate G3. Capacitor $C_L$ represents the sum of: load capacitances, gate G3 output capacitance, gate G4 input capacitance, and other parasitic capacitors at node Q. Similarly, capacitors $C_{IN}$ and $C_{G3}$ model the sums of input and all parasitic capacitors at nodes $D_{1tch}$ and $G_{3in}$, respectively. Resistors $R_2$ and $R_3$ model the resistances of transmission gates TG2 and TG, respectively. Inverters G1 and G3 are assumed to be ideal, with threshold voltages of $V_{thG1}$ and $V_{thG3}$ respectively.

For correct operation of the circuit, the change in voltage occurring at node $D_{1tch}$ of the loop during the settling period must be limited to a magnitude that keeps the output of gate G1 constant while the circuit reaches its stable state. Thus, during the settling process, the instantaneous value of the voltage on node $D_{1tch}$ cannot cross the voltage threshold $V_{thG1}$, This constraint will determine the required ratio of the time constants of the transmission gates. Our goal is to derive the ratio of resistance between transmission gates TG2 and TG3 for correct operation of the circuit.

The following equations help describe the behavior of the circuit under critical race control. These equations and the models used are approximations. Still, they clearly show the main approach to control critical races. For detailed design of the final circuit within a specific technology and under well-defined environmental conditions, computer aided software is necessary.

The derivation follows the assumption shown in FIG. 3a with a present state: Q=0 and an input value of VDD. The same set of equations is obtained in the complementary case when Q=1 and an input value of 0.

The minimum voltage (maximum for the case of Q=1 and D=0) allowed on node $D_{1tch}$ for correct circuit operation is computed by first finding the time of its occurrence, then computing the corresponding voltage at that time. The analysis in FIG. 4a begins at time t=$t_{0+}$, when the clock voltage switches from LOW to HIGH and transmission gates TG2 and TG3 toggle to their "ON" state. The initial conditions at that time are shown in FIG. 4a: $V_{D1tch}$=VDD, $V_{Db}$=0, $V_{G3in}$=VDD and $V_Q$=0. Due to the conflicting values appearing at the terminals of TG3, the initial voltage of VDD on capacitor $C_{G3}$ will decrease. This voltage will decay through $R_3$ from its initial value of VDD according to the well-known exponential voltage decay law:

$$V_{CG3}(t) = VDDe^{-\frac{t}{R_3 C_{G3}}}$$

Gate G3 will toggle and provide an output voltage of VDD when $V_{CG3}(t)$ drops below the threshold voltage $V_{thG3}$. The switching time of the idealized G3 is assumed negligible. The elapsed time for $V_{CG3}(t)$ to reach the threshold voltage $V_{thG3}$ is labeled $t_1$, and can be expressed as (equation 1):

$$t_1 = R_3 C_{G3in} \ln \frac{VDD}{V_{thG3}} \tag{1}$$

During the same time period, from $t=t_{0+}$ to $t=t_1$, the voltage on capacitor $C_{IN}$ discharges through $R_2$ according to:

$$V_{CIN}(t) = V_{CIN}(0^+) e^{-\frac{t}{R_2 C_{IN}}}$$

Using the expression for $t_1$ just found, the voltage on $C_{IN}$ at time $t_1$ with initial value $V_{CIN}(0^+)=VDD$, can then be expressed as (equation 2):

$$V_{CIN}(t_1) = V_{D1tch}(t_1) = VDDe^{-\frac{R_3 C_{G3} \ln \frac{VDD}{V_{thG3}}}{R_2 C_{IN}}} \tag{2}$$

Figure 4B:
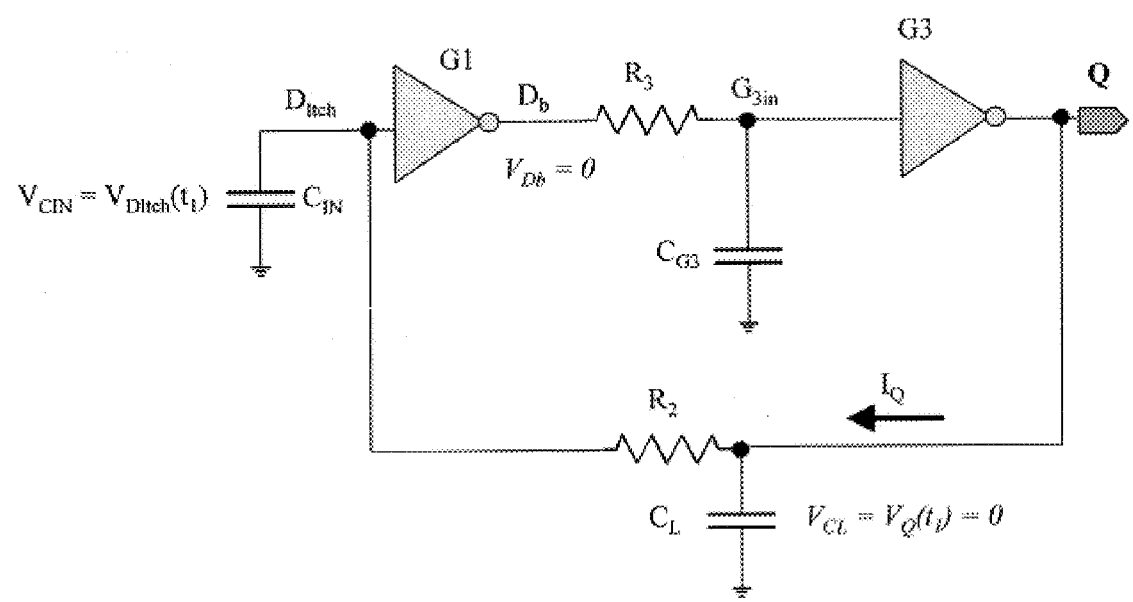
FIG. 4b represents the equivalent electrical circuit of the logic circuit in FIG. 3b during the settling time of the shared loop, at the time node Q transitions from a low to a high value.

After G3 toggles node Q has value VDD and the state of the circuit is as shown in FIG. 4b. Gate G3 is modeled as a current generator supplying a current $I_Q$. This current charges capacitor $C_{IN}$ so as to keep $V_{CIN}$ above the threshold voltage $V_{thG1}$ of inverter G1. For the time period after $G_3$ toggles, i.e. for $t \geq t_1$, the voltage on node $V_{CIN}$ is given by the superposition of the voltages due to the charging current $I_Q$ and the discharging of capacitor $C_{IN}$ from its initial value $V_{D1tch}(t_1)$ (equation 3):

$$V_{CIN}(t) = \tag{3}$$

$$\frac{I_Q}{C_{IN}+C_L}\left[t + R_2 C'\left(e^{-\frac{t}{R_2 C'}} - 1\right)\right] + V_{Dltch}(t_1)\left[\frac{C_{IN}+C_L e^{-\frac{t}{R_2 C'}}}{C_{IN}+C_L}\right]$$

where $C' = \frac{C_{IN} C_L}{C_{IN}+C_L}$

The voltage on capacitor $C_{IN}$ reaches its minimum when the charging rate equals the discharge rate. This condition is equivalent to the first derivative of $V_{CIN}(t)$ being equal to 0. Thus to find this time labeled $t_2$:

$$\frac{\partial V_{CIN}(t)}{\partial t} = \frac{I_Q}{C_{IN}+C_L}\left[1 - e^{-\frac{t}{R_2 C'}}\right] - V_{Dltch}(t_1)\frac{C_L e^{-\frac{t}{R_2 C'}}}{(C_{IN}+C_L)R_2 C'} = 0$$

which results in:

$$t_2 = R_2 C' \ln\left[1 + \left(1 + \frac{C_L}{C_{IN}}\right)\frac{V_{Dltch}(t_1)}{I_Q R_2}\right]$$

The minimum value of $V_{CIN}$ must remain above the threshold $V_{thG1}$ in order for the circuit to operate correctly. This minimum can now be obtained by inserting $t=t_2$ in eq. (3). The minimum voltage is then obtained as:

$$V_{CIN}(t_2) = \frac{C_{IN}}{C_{IN}+C_L} \tag{4}$$

$$\left\{I_Q R_2 \frac{C_L}{C_{IN}+C_L}\ln\left[1+\left(\frac{C_L}{C_{IN}}+1\right)\frac{V_{Dltch}(t_1)}{I_Q R_2}\right] + V_{Dltch}(t_1)\right\} > V_{thG1}$$

The ratio $$\frac{R_3}{R_2}$$

can now be found by inserting the value of $V_{D1tch}(t_1)$ in eq. (4).

The result is a transcendental equation that generally has to be resolved using computer software. However a coarse indication of the ratio can be obtained by using the following approximations: Looking at equation (4) and assuming that $I_Q R_2 \gg V_{D1tch}(t_1)$ then the logarithmic term in the braces is much smaller than $V_{D1tch}(t_1)$. We are then left with the following simplified equation $$V_{CIN}(t_2) = \frac{C_{IN}}{C_{IN}+C_L}\{V_{Dltch}(t_1)\} > V_{thG1} \tag{5}$$

Inserting the value of $V_{D1tch}(t_1)$ from eq. (2) we obtain $$\frac{C_{IN}}{C_{IN}+C_L} VDDe^{-\frac{R_3}{R_2}\frac{C_{G3}}{C_{IN}}\ln\frac{VDD}{V_{thG3}}} > V_{thG1} \tag{6}$$

From eq. (6) we obtain the ratio $$\frac{R_3}{R_2}$$

as:

$$\frac{R_3}{R_2} < \left(\frac{C_{IN}}{C_{G3}}\right)\frac{\ln\left[\frac{VDD}{V_{thG1}\left(1+\frac{C_L}{C_{IN}}\right)}\right]}{\ln\left(\frac{VDD}{V_{thG3}}\right)} \tag{7}$$

Assuming all capacitances and threshold voltages to be equal, then with a threshold voltage $V_{th} = \frac{1}{3}VDD$, we obtain $$\frac{R_3}{R_2} < 0.37.$$

This result clearly indicates the need for TG3 to have a lower propagation delay than that of TG2 for correct operation of the circuit.

In practice, the ratio of the resistances is obtained by simulating the circuit under all operating conditions using computer aided design software.

As shown in eq. (2) a small value of $R_3$ reduces $t_1$ while a small value of $R_2$ reduces $t_2$; a small ratio $$\frac{R_3}{R_2}$$

reduces the voltage decay of $V_{CIN}(t)$. The total time $t_1+t_2$ can be minimized through the choice of $R_1$, $R_2$ and $I_Q$ as shown in eqs. (2), (3) and (4). Reducing $C_L$, the load on node Q, also reduces $t_2$ through reduction of C'.

As the above discussion shows, correct circuit operation is ensured by regulation of the ratio $$\frac{R_3}{R_2},$$

which is the ratio of the equivalent resistances of transmission gates TG3 and TG2. The preferred embodiment of critical race control therefore controls critical races through the calculated regulation of transistor resistances in the transmission gates.

It will be readily apparent to persons skilled in the art that there exist many variations on how to implement the delay in the various sections of the loop. For example the slower of the two transmission gates, TG2 in FIG. 2, can be replaced by two weak transistors that are 'ON" all the time. The transistors act like large resistive value resistors. Alternatively a large passive resistor can replace the two transistors to reduce contacts and connections. These implementations lighten the current load required from the clock source and its complement. Alternatively the inverter and the transmission gate can be integrated together to form a switched inverter with all the variations available as shown in the prior art.

It will also be readily apparent to persons skilled in the art that the critical race control principle can also be applied to other circuits such as multi-loop circuits where some paths share more than two loops. In such cases the delay in a loop section might be needed to be low when embedded in one loop and high when embedded in another loop.

Critical race control can also be implemented in circuits where single pass transistors are used in preference to transmission gates. The modification of the delay is obtained by changing the dimensions of the appropriate pass transistors.

However due to its innovative principle of inserting a relative delay in digital circuits, critical race control can also be used to develop new kind of integrated circuits and applications resulting in circuits with smaller silicon area and lower power dissipation.

Figure 5A:
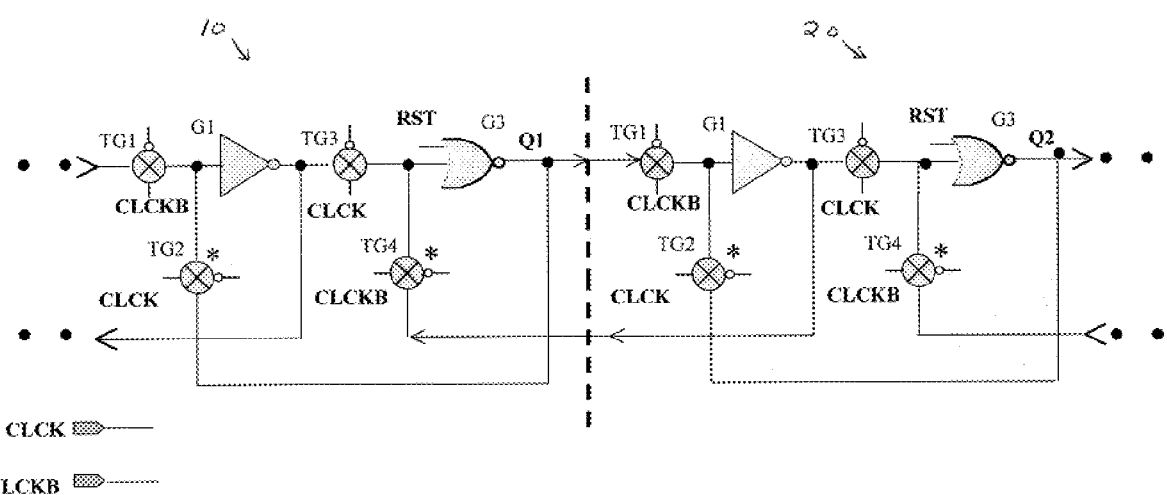
FIG. 5a shows an embodiment of a static shift register comprising fewer gates and shared circuit paths wherein critical races are controlled by adjusting the ratio of the resistances of the transmission gates.
Figure 5B:
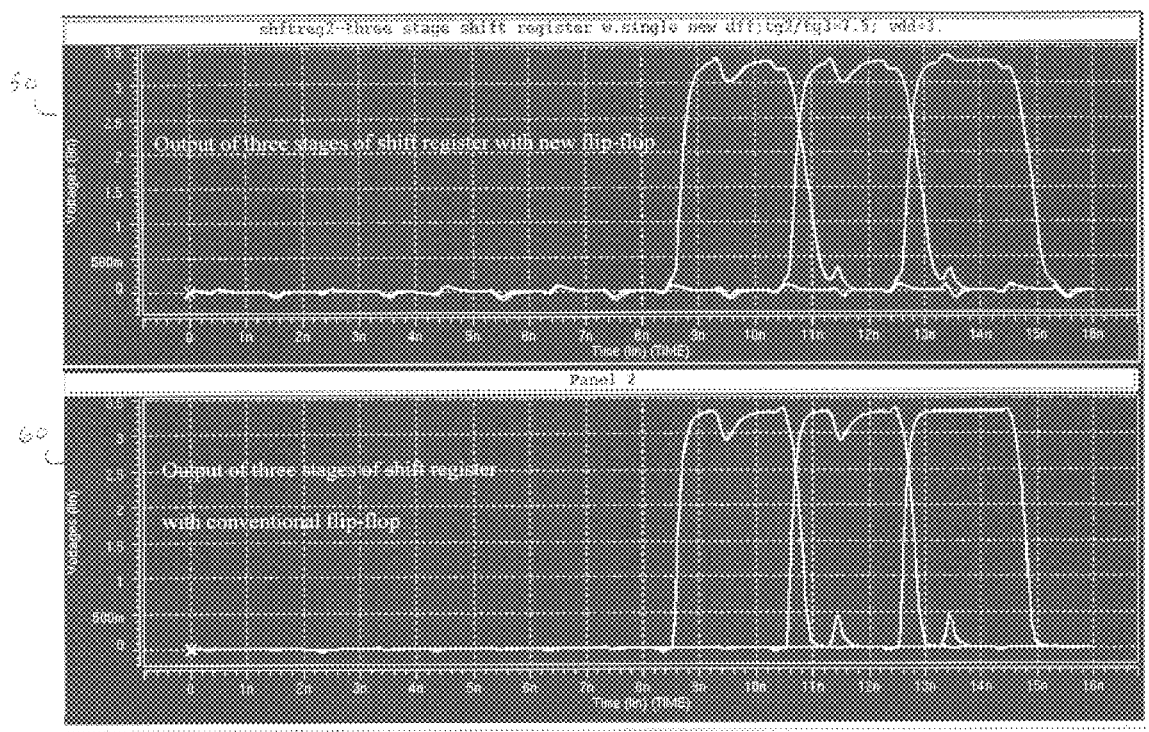
FIG. 5b compares output waveforms from two 3 stage shift registers: one shift register implemented with conventional D flip-flops as shown in FIG. 1 and the second implemented with the new structure as shown in FIG. 5. The two sets of waveforms are undistinguishable demonstrating the speed equivalence of the two structures.
Figure 5C:
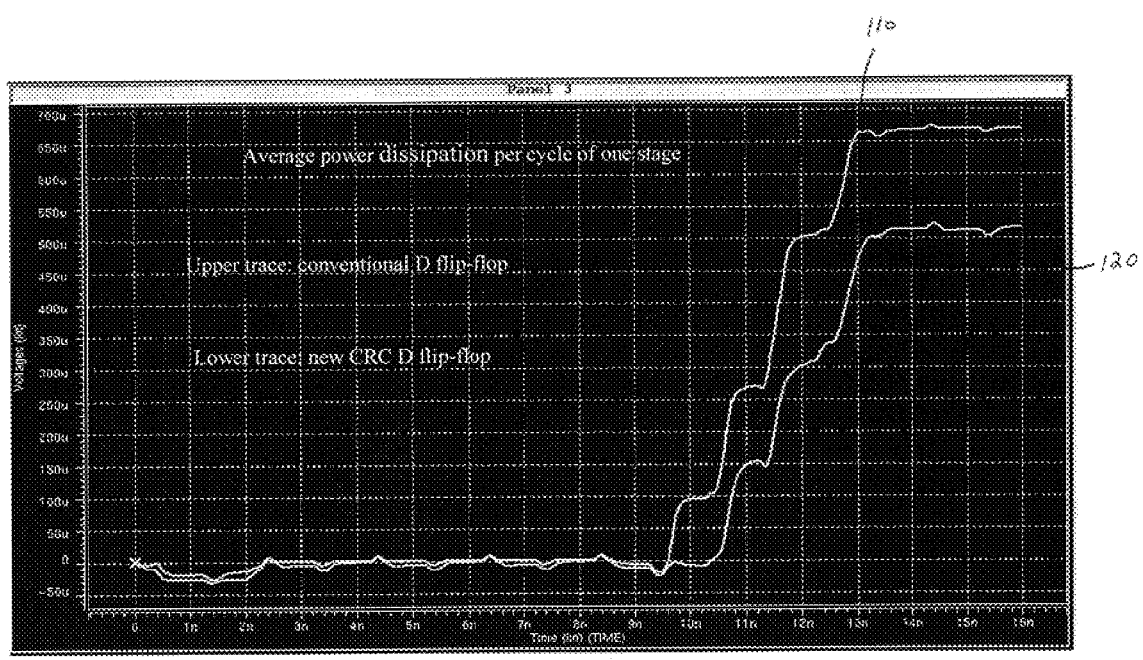
FIG. 5c compares the average power dissipation during a clock period of one stage of the shift registers. The new structure demonstrates, with this particular design, about 23% lower power dissipation.

The following are some examples of new circuits or improvements to existing ones when using the critical race control technique. FIG. 5a–c shows how reduction in the number of gates enabled by critical race control can be further applied to substantially lower both the power dissipation and the number of gates, therefore the silicon area, required to implement registers on a chip. The technique used to eliminate gate G2 in FIG. 1 can also be used to eliminate gate G4 when the flip-flop is followed by another flip-flop as occurs in shift registers, counters and other circuits.

FIG. 5a shows two stages 10, 20 of a static shift register as delimited by the heavy broken line. Inverter G4 of the left stage 10 (flip-flop, with output Q1) that appears in FIG. 1 has been eliminated. The input to gate TG4 is now provided by the output of inverter G1 of the following stage (right flip-flop with output Q2). This creates the loop: TG4, G3 (left stage), TG1, G1 (right stage). The control of the critical races in this loop is done as described above. By increasing the delay of gate TG4 with respect to the delay of gate TG1 (of the following stage) the signal coming from Q1 will toggle gate G1 before the old signal at the output of G1 has the opportunity to (wrongly) toggle gate G3 of the left flip-flop. This difference in delays will ensure correct operation of the circuit.

The resulting stage consists now of four transmission gates: TG1, TG2, TG3 and TG4 and of two gates only: G1 and G3. It requires therefore less silicon area for implementation. As the number of gates in which transistors are connected between the power supply and ground is minimized, this stage also consumes less power.

Thus in all stages of the shift register, except the final one, the critical race conditions are controlled by the ratio of the resistances of transmission gates TG3 and TG2 in the same stage, and that of transmission gate TG4 with that of transmission gate TG1 in the following stage. The final stage of the example shown in FIG. 5a is configured as the flip-flop shown in FIG. 2.

FIG. 5b compares the output waveforms from each stage of two 3-stage shift registers. The lower panel 60 output waveforms belong to the shift register implemented with conventional D flip-flops while the upper panel 50 output waveforms belong to the shift register using critical race control D flip-flops as shown in FIG. 5a. The similarity between the waveforms demonstrates that the critical race control D flip-flop has speed and delay characteristics almost identical to those of the conventional D flip-flop.

FIG. 5c shows the integration of the current waveforms, resulting in the average power dissipation, of the two kinds of flip-flops over one period of the clock according to: [3] Sung Mo Kang, "Accurate Simulation of Power Dissipation in VLSI Circuits", IEEE Journal of Solid-State Circuits, Vol. SC-21, No. 5, October 1986, pp. 889–891.

The ordinate in FIG. 5c represents micro-watts. The first trace 110 represents the average power dissipation per clock period of the conventional D flip-flop that reaches a maximum of about 670 micro-watts during one clock period. The average power dissipation of the CRC D flip-flop under the exact same conditions, represented by the second trace 120, reaches a level of about 520 micro-watts thus demonstrating the lower power dissipation of the CRC D flip-flop as compared to a conventional one.

Additionally, it will be noted that inverting the ratio of resistances of TG2 to TG3 and of TG1 to TG4 in FIG. 5a causes the same shift register circuit to shift data in the reverse direction while operating with the same clock. This operation in the reverse direction without the need of a reverse clock signal is obtain due to the property of the critical race control technique which allows us to specify which of the two inputs will be the final value latched in the loop. One input to the loop is the conventional output of the previous stage. The second input available in the CRC flip-flop is the one coming from the next stage.

The invention embodies therefore two basic elements: one element is a loop that is divided into two or more sections and allows therefore two or more inputs respectively to be inputs to the loop. The second element is the control of the delay of each section by sizing the elements of its transmission gate and by sizing the currents of the inverters in the loop. In the present examples, when the loop is divided into two sections and allows two inputs, the loop exhibits bidirectionality, which is the capability of latching the value either from its left input or from its right input.

Figure 6A:
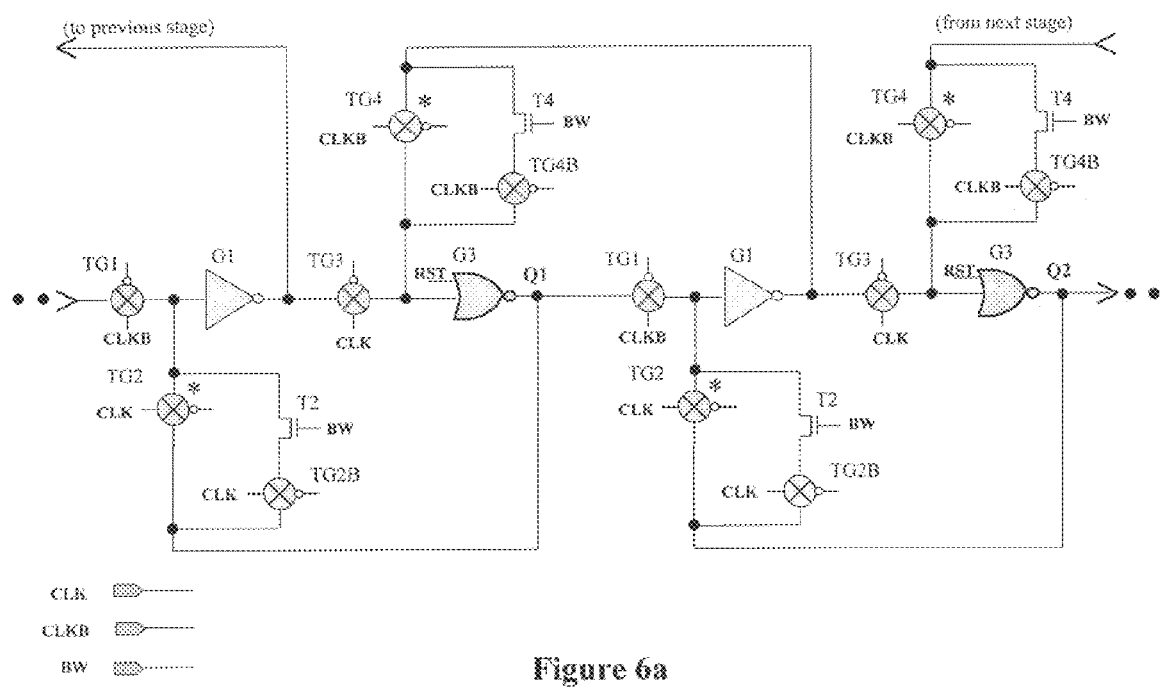
FIG. 6a shows an embodiment of an integrated right-shift left-shift register wherein critical races and direction of data flow are controlled by the ratio of the resistance of the transmission gates as indicated. This circuit does not require the additional logic circuits and connections needed in conventional implementation of this function. Control of the left or right direction of data flow is done using the control line BW. To obtain left (backward) direction of data propagation the transmission gate resistance ratio is switched to a different value than that chosen for the forward direction of data propagation.

A shift left/shift right register is shown in FIG. 6a where two transmission gates labeled TG2B and TG4B, and two transistors labeled T2 and T4 are added in each latch to provide the ratio of delays needed to shift the data in the reverse direction.

Figure 6B:
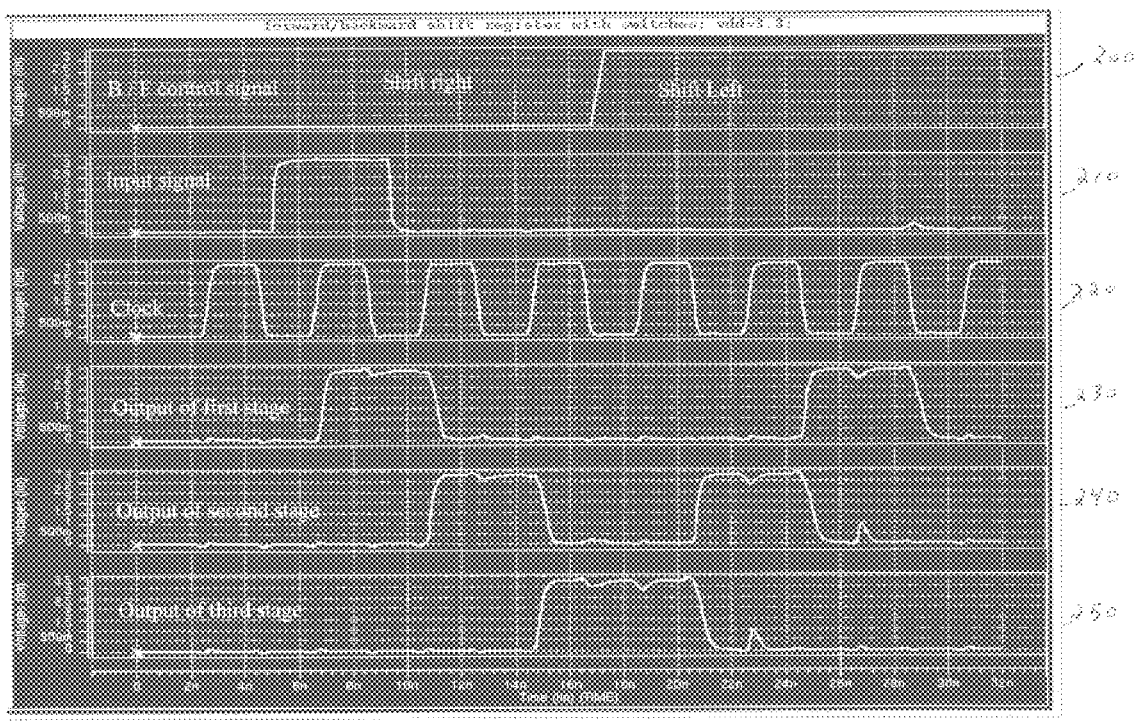

The representative waveforms 200, 210, 220, 230, 240, 250 are illustrated in FIG. 6b. The uppermost waveform 200 is the B/F Control signal showing the Shift Right and Shift Left. The next waveform 210 is the Input signal, followed by the Clock 220. The next three waveforms are the outputs of the first stage 230, second stage 240 and third stage 250.

A control signal, labeled BW, controls the desired forward and backward data shifting directions by enabling transistors T2 and T4. When the forward direction is desired, the signal BW=0 and transistors T2 and T4 are off. Transmission gates TG2B and TG4B are disconnected and the CRC circuit reverts to its forward data shifting function according to the correct sizing of transmission gates TG2 vs. TG3 and TG4 vs. TG1 of the following stage as shown in FIG. 5a.

When the backward data shifting direction is desired, the control signal BW=1. This activates transistors T2 and T4 and connects transmission gates TG2B and TG4B in parallel to transmission gates TG2 and TG4 respectively. Transmission gates TG2B and TG4B are sized so that, together with transmission gates TG2 and TG4 respectively in parallel, they have smaller transmission delays than transmission gates TG3 and TG1 (of the next stage) respectively.

When CLK is low, in each stage of the shift register transmission gates TG4, TG4B and TG1—belonging to the stage on the right—are open (on) and transmission gates TG3, TG2 and TG2B are closed (off). The upper loop in each stage, comprising TG4 in parallel with TG4B, G3 and TG1 and G1 from the stage on its right, is closed and the lower loop consisting of G1, TG3 G3 and TG2, is meanwhile open.

The upper closed loops supply different voltages at the terminals of transmission gates TG2 and TG3. Node Q1, through TG1, applies a voltage at one terminal of TG2 in parallel with TG2B while node Q2 (next stage) supplies a different voltage at the second terminal of TG2 in parallel with TG2B. Similarly, the voltages at each terminal of TG3 come from the closed loops from different stages.

Transmission gate TG2B, in parallel with TG2, is sized to have a smaller delay than transmission gate TG3. Thus when CLK goes high, and CLKB goes low, the value of Q2 will be the preferred value latched in the loop consisting of G1, TG3, G3 and TG2B in parallel with TG2. Thus the value that was previously in the upper loop now appears in the lower loop at its left. Similarly, transmission gate TG4B, in parallel with TG4, is sized to have a smaller delay than transmission gate TG1. Thus when CLK goes high, and CLKB goes high, the value at the output of G1 will be latched in the closed loop consisting of TG1, G1, TG4B in parallel with TG4 in preference to the value on node Q1. Therefore the value that was in the previous lower closed loop now appears in the upper loop on its left. These operations are done in all stages of the shift register synchronously.

This circuit has no equivalent in present integrated circuits as those require an additional clock signal to shift data in the reverse direction. The proposed CRC circuit uses only one clock signal for shifting data left or right and is an example of the capabilities of the CRC method.

It will be readily apparent to persons skilled in the art that the loops can be implemented with more than two sections and that this configuration can then be extended to comprise multi-loops, not just left and right ones.

Figure 7:
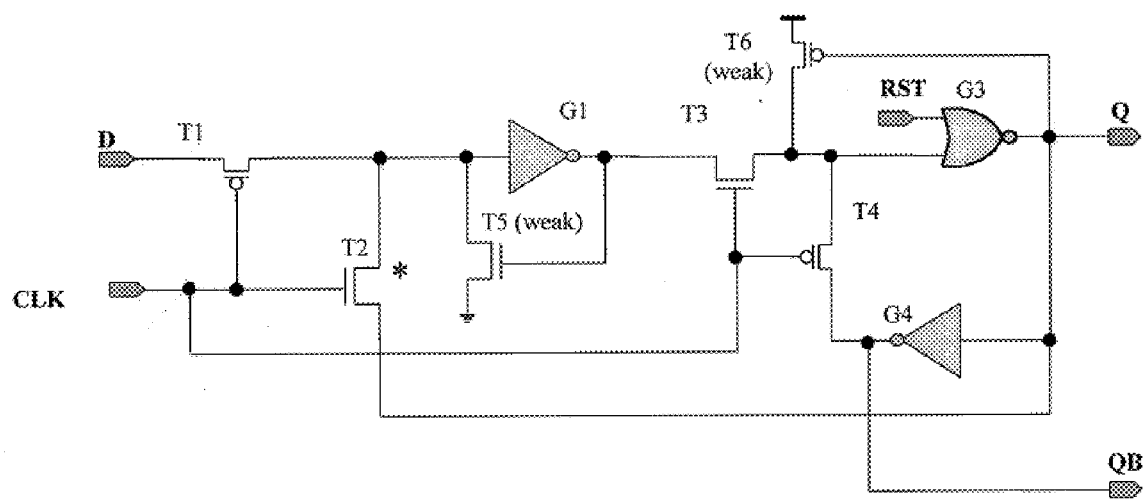
FIG. 7 shows an embodiment of the new D flip-flop using single pass transistor instead of transmission gates and a single-phase clock

The CRC method can also be exploited in all the common circuit variations used for implementation of D flip-flops. FIG. 7 shows the embodiment of the CRC D flip-flop operating with a single clock phase, also called "True Single Phase Clock" (TSPC). The transmission gates are replaced by single pass-transistors. Thus transistors T1, T2, T3 and T4 in FIG. 7 replace transmission gates TG1, TG2, TG3 and TG4 respectively in FIG. 2. A weak n-type transistors T5, fed from the output of G1, has been added to act as pull-down at the input of gate G1. This transistor eliminates the $V_{th}$ loss associated with the p-type single pass transistor T1. Similarly the weak p-type transistor T6 at the input of G3 acts as pull-up to eliminate the $V_{th}$ loss associated with the single pass transistor T3. When operating in a shift register gate G4 can be further eliminated by feeding T4 from the output of gate G1 in the following stage similarly to the operation of the shift register stages shown in FIG. 5. When G4 is eliminated and G3 is replaced by an inverter a shift register stage can be implemented with 10 transistors only Critical Race Control can also be used to reduce the silicon area required for implementation and to lower the power dissipation of conventional circuits such as static double edged-triggered D flip-flops (DETDFF). DETDFF's move data at each clock transition (low to high and high to low), which doubles the data throughput at a given clock speed or, alternatively, halves the clock speed necessary for a given data flow obtaining thus substantial reduction in power dissipation. However, conventional techniques of constructing static double-edged flip-flops require a large numbers of components and results in relatively large circuit size and power consumption. Accordingly, the circuits have not been an attractive alternative for addressing the circuit data throughput and speed objectives discussed above.

Figure 8:
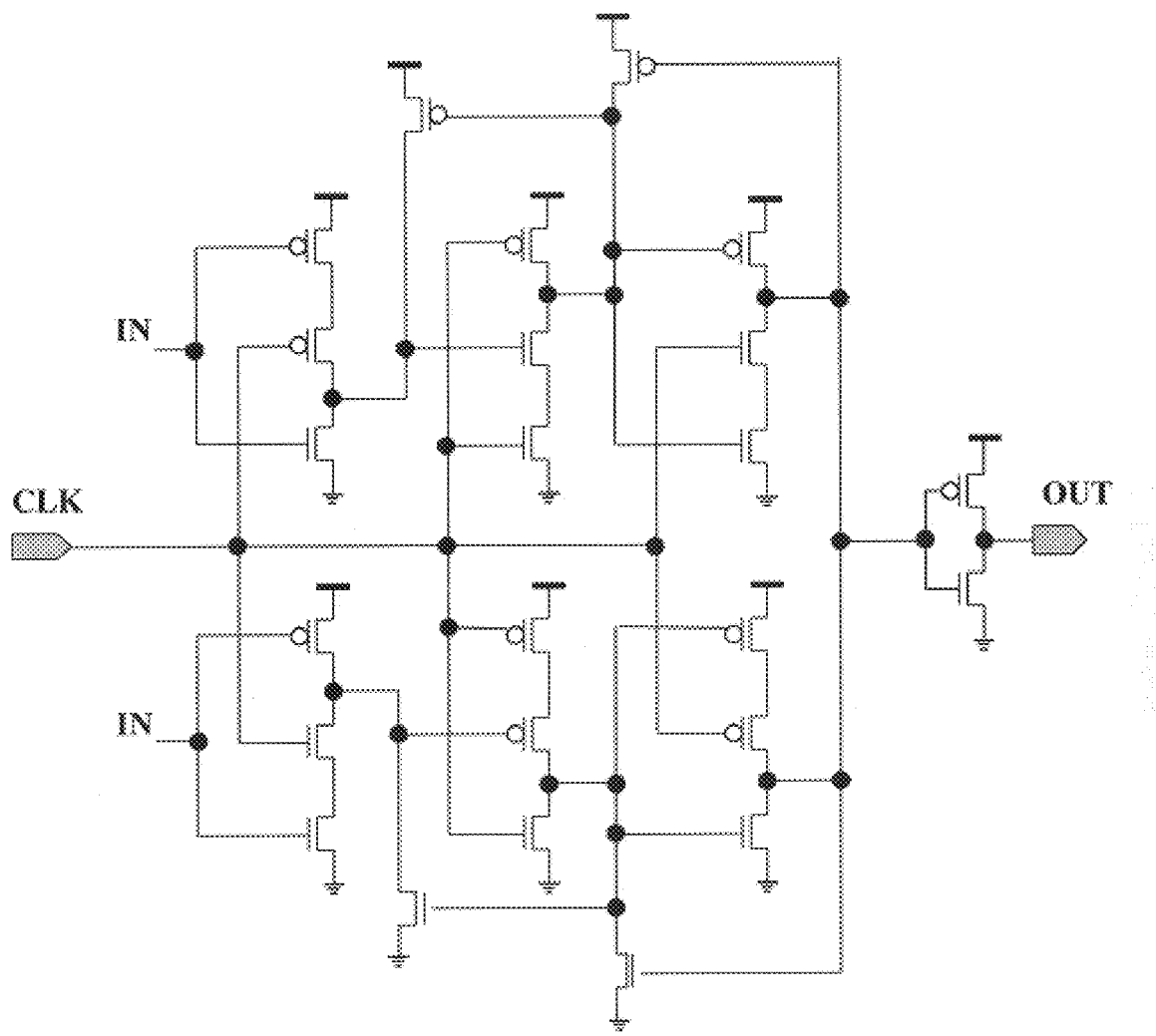
FIG. 8 shows a conventional static double-edged triggered flip-flop circuit.

A typical static DETDFF is shown in FIG. 8 (See K. Y. Yun et. al. "High-performance two phase micropipeline building blocks: double edge-triggered latches and burst-mode select and toggle circuits", *IEE Proc.-Circuits Devices Syst.*, Vol. 143, No. 5, October 1996, pp.282–288). This device is essentially a pair of static true single-phase master-slave flip-flop circuits configured in parallel, such that one flip-flop responds to the clock going high and the second flip-flop responds to the clock going low. The outputs of both flip-flops are then summed to a common output.

Figure 9A:
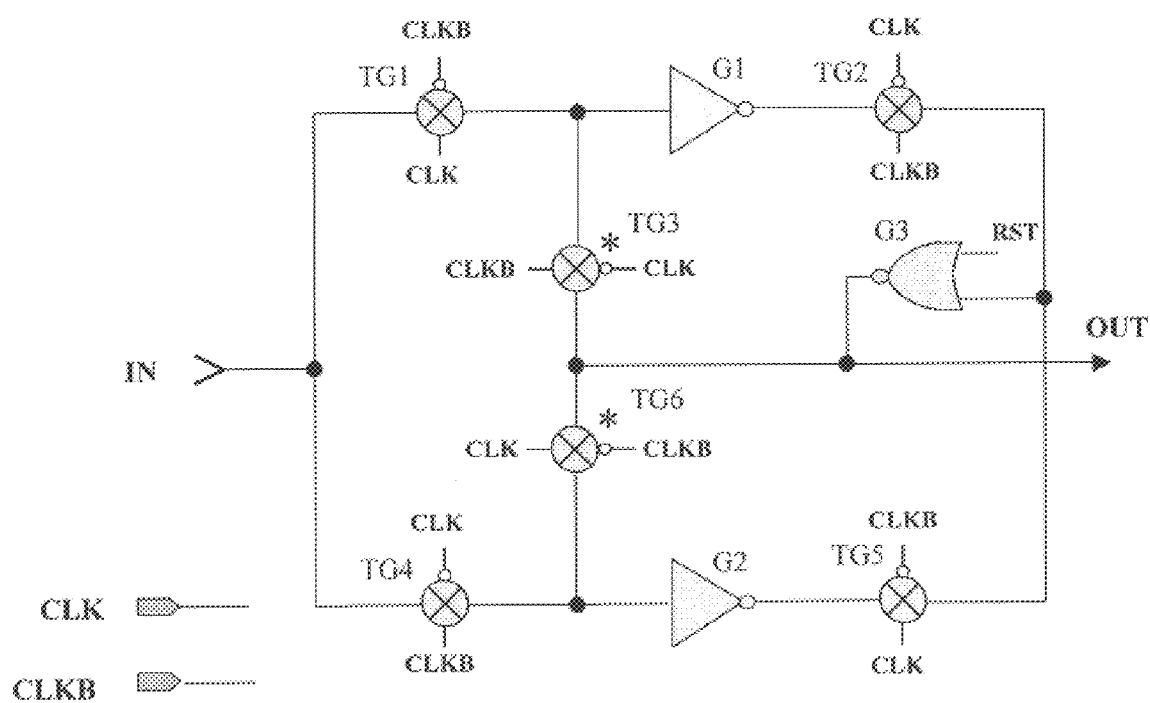
FIG. 9a shows an embodiment of a static double-edge triggered flip-flop comprising shared circuit paths wherein critical races are controlled by adjusting the ratio of the resistances of the transmission gates.

FIG. 9a shows an embodiment of a static DETDFF constructed according to the critical race control technique. This circuit uses fewer components than a similar circuit of conventional design, and therefore it requires less silicon area for implementation. In FIG. 9a gate G3 is shared by the upper loop comprising gates G1, TG2, G3, TG3, and by the lower loop comprising gates G2, TG5, G3 and TG6. When the clock is low, transmission gates TG2, TG3, and TG4 are open, and transmission gates TG1, TG5, and TG6 are closed. The upper loop is now latched and determines the output of the DETDFF. During that period the new data appears trough transmission gate TG4 at the output of Gate G2. When the clock goes high, all transmission gates switch to their complementary states. The lower loop is now latched and determines the output of the DETDFF.

The critical race control technique is applied in each loop to prevent the critical race arising between the new incoming data and the previous data. For example when the clock goes high the new value appearing (inverted) at the output of G2 has to compete—if different—with the data latched at the previous clock transition and appearing at the output of G3 in the (lower) loop consisting of G2, T5, G3 and T6. For correct operation the new data appearing inverted at the output of G2 should prevail. According to the critical race control technique the data path from the output node of G3 to the input node of G2 should have longer propagation delay than the path from the output node of G2 to the input node of G3. Therefore transmission gate T6 is designed to have a larger delay than transmission gate T5. T6 is accordingly labeled with an asterisk. Similarly in the upper loop, transmission gate T3, also labeled with an asterisk, has a delay larger than transmission gate T2 to control the critical race in that loop.

Figure 9B:
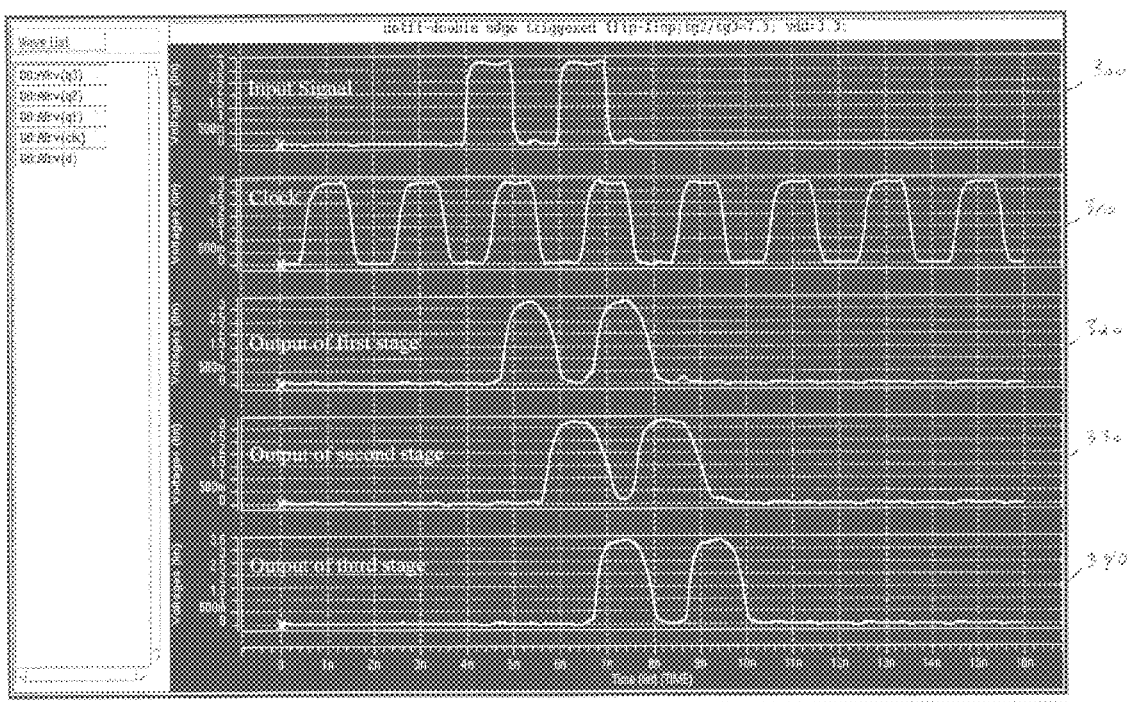
FIG. 9b is a graphical presentation of the outputs of the shift register using double-edge flip-flops.

FIG. 9b shows the waveforms 300, 310, 320, 330, 340 resulting from the simulation of a shift register using double edge-triggered D flip-flops implemented according to the CRC architecture. The upper trace 300 represents the input signal. The second trace from the top 310 shows the clock waveform. The last three waveforms show the output of the first 320, second 330 and third stage 340 of the shift register respectively. As can be seen the circuits respond to each transition of the clock. It should be clear to those skilled in the art that different embodiments of the circuit shown in FIG. 9a are possible.

It is readily apparent that this new architecture, using critical race control, can easily be used for the realization of T and J-K double edge-triggered master/slave flip-flops as the various types of flip-flops differ only by the type of combinational circuits connected at their input nodes.

The technique of critical race control as applied to synchronous sequential circuits can also be applied to asynchronous sequential circuits. The application of critical race control to asynchronous circuits is particularly relevant as up to the present the primary objective of asynchronous networks consisted in choosing a state assignment that prevented critical races while simplification of the logic was relegated to secondary considerations. Using the critical race control technique can therefore lead to a reduced number of logic gates needed to implement asynchronous circuits, and to a reduction in power dissipation, without further concern about critical races as they can easily be controlled.

Figure 10A:
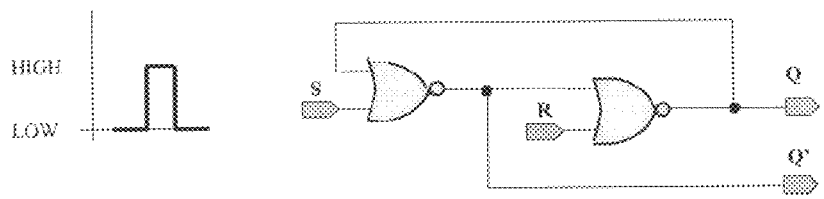
FIG. 10a shows the implementation of a set-reset latch (S-R latch) using NOR gates and requiring rising pulses to set and reset the latch.
Figure 10B:
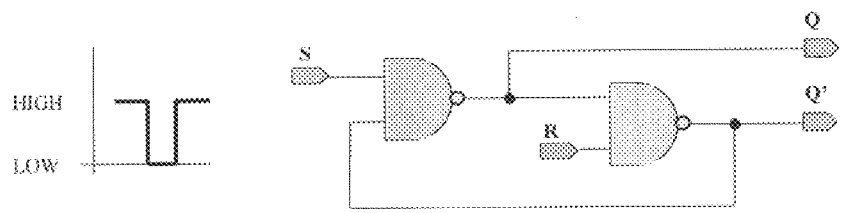
FIG. 10b shows the implementation of the same S-R latch but using NAND gates and requiring negative going pulses to set and reset the latch.

The basic sequential element in asynchronous circuits is the Set-Reset (S-R) latch. The S-R latch stores 1 bit of information and consists of two cross-coupled NAND or NOR gates with two inputs labeled S and R and two output nodes labeled Q and Q', where node Q' indicates the complement of Q. Implementation of the S-R latch with NOR gates and with NAND gates are shown in FIGS. 10a and 10b respectively.

In S-R latches implemented with 2 NOR gates in a cross-coupled circuit, a positive voltage level applied at input S sets node Q' to a LOW logic value after some delay and consequently output Q to a HIGH logic value after an additional delay. The latch stays in this state until a positive voltage level applied to input R resets the state of the latch to Q=0 after some delay and consequently Q'=1 after additional delay. According to present circuit implementations inputs S and R can never be applied simultaneously as the final state of the latch cannot easily be determined in this case. The final state of the S-R latch will be determined by which of the input nodes, set or reset, will be the last one to undergo a falling edge.

In S-R latches implemented with 2 cross-coupled NAND gates, a negative voltage level applied at input S sets the output Q to a HIGH logic value after some delay and consequently node Q' to a LOW logic value after additional delay. Note that the location of the Q and Q' outputs in relation to the inputs, and therefore their delays, are different from those of the NOR-implemented latch. The latch stays in this state until a negative voltage level applied to input R resets the state of the latch to Q'=1 after some delay and consequently node Q=0 after additional delay. Similarly to the NOR-implemented latch, inputs S and R can never have inputs applied simultaneously.

The application of critical race control to an asynchronous circuit can be demonstrated using the following example. FIG. 11 shows an asynchronous sequential circuit with critical races. The circuit consists of two NAND-implemented S-R latches with combinational circuits at the Set and Reset nodes of each of the two latches.

The operation of the circuit is the following: when the external input X is 0 (Xb=1) and with internal state Q1Q2= 00 (Q1bQ2b=11), then S1, R1 and S2=1, while R2=0. This initial state is thus stable as the input, X=0 does not cause changes in Q1 and Q2.

Critical races occur when X=1 (Xb=0). At that instant a negative pulse appears at both S1 and S2 nodes while node R1 remains at 1 and node R2 reverts from 0 to 1. When the two latches are thus in the set state both Q1 and Q2 should rise to 1. The final state of the circuit depends on which of nodes Q1b or Q2b (and therefore also Q1 and Q2) switches first. If, due to lower parasitic capacitances at the S1 node and lower loading at the Q1 and Q1b outputs, the first latch is set (Q1=1, Q1b=0) before the second latch, the circuit will reach the stable state in which X=1 and Q1=1 and Q2=0. If, on the other hand, the second latch is set first (Q2=1, Q2b=0), the circuit will reach the equally stable state in which X=1 and Q1=0 and Q2=1. A third stable state is also possible if the latches in the circuit behave identically. If both Q1 and Q2 switch to 1 simultaneously (Q1b=Q2b=0), the circuit will remain in this stable state as S1=R1=S2= R2=1.

Using the critical race control technique the final state of the circuit can be unambiguously determined by controlling the delays in the various parts of the loop. The redrawn circuit is shown in FIG. 12. Two main loops are present in the circuit. The first loop consists of gate G1, driving node S1, through Latch1 to output Q1b, to gate G2 driving node S2, through output Q2b of Latch2 and back to gate G1. The second loop consists of gate G3 driving node R1 through the output Q1b of Latch1 to gate G4 driving node R2, through Latch2 to the output Q2 and back to gate G3.

Thus, if the delay beginning from input X at gate G1 to output node Q1b of Latch1 is smaller than the delay from input X at gate G2 to node S2 of Latch2, Latch1 will be set before Latch2 and the first final state described herein will be established. In the reverse case, the second final state will be established. If the delays are exactly identical, the third stable state will be established.

The increase in delay of one part of the loop versus the other can be concentrated in more than one gate. Thus delaying the setting of the second latch with respect to that of the first latch is obtained by including none, part or all of the delay in the latches themselves.

It should be readily apparent to the person skilled in the art that the critical race control method can be applied to insure that simultaneous application of both set and reset pulses will yield unambiguous result when maximum pulse width is known. In that case, the maximum time of occurrence of the trailing edge of either the set or reset pulse can be calculated and taken into consideration when designing the difference of delays of the sections of the loop.

Figure 13:
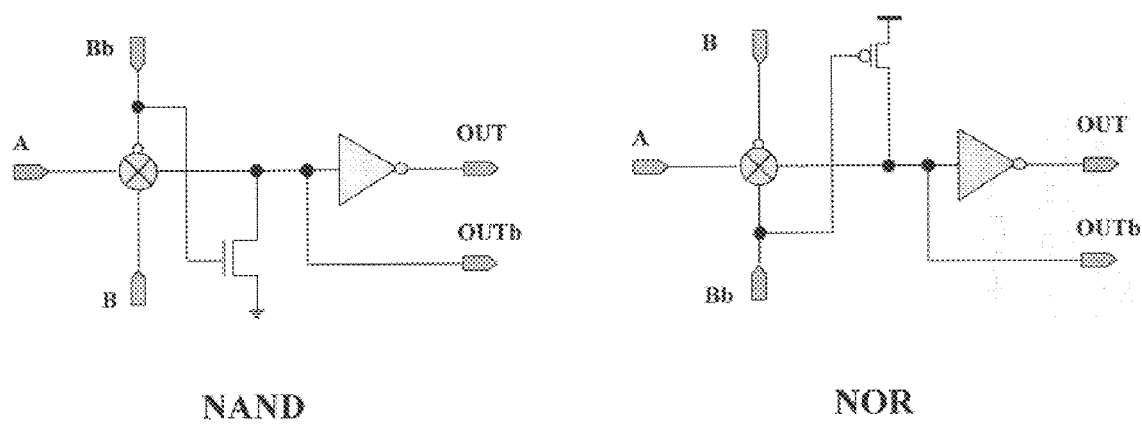
FIG. 13 shows the implementation of NAND and NOR logic gates with transmission gates. These gates, or a modified version of them, can be used for implementing the combinational circuit controlling the set and reset nodes of the latches. Use of such gates allows for the adjustment of the delays of the individual sections of the loop.

Gate delay modification can be obtained by modifying the sizes of two transistors in a transmission gate and/or modifying the size of the transistors in the latches. Two input logic gates such as OR, AND, NOR and NAND can be implemented using transmission gates for ease of delay modification as shown in FIG. 13 for NAND and NOR logic functions. Modifying the sizes of four transistors in a standard logic gate is feasible but more cumbersome if proper switching threshold value has to be retained.

It should be readily apparent from the examples described above that the critical race control technique is effective in controlling critical races in multi-loop circuits by choosing adequate resistance ratios to accommodate the delays between various loops. The delay difference between the various parts of the loop is obtained by modifying the transistor sizes in the transmission gates. While this is the preferred method, other means are also available such as modifying the size of the transistors in the logic gates, modifying parasitic capacitances, modifying the threshold of the transistors or any other technique presently available. The delay ratio can also be implemented using the wide range of techniques presently in use such as single pass transistors, single polarity clock signal and transistor and gate threshold modification.

Also, alternate means exist for regulating the relative delays. For example, a transistor in the path of a critical race might be robustly configured as a high/low switch or gate shunt, being responsive to selective control. Therefore, the "ideal" regulation values for delays and resistance ratios between gates in a particular application are best determined experimentally for the particular application.

The critical race control innovation can be used to develop new integrated circuits that have at present no integrated equivalent. Alternatively, it can be implemented as a retrofit to improve existing systems.

It is readily apparent that the critical race control technique can be used in synchronous and asynchronous circuits with any of the methods for implementing the delays and is not limited to the embodiments presented herein. Various variations and modifications may be made without departing from the scope of the present invention Numerous characteristics and advantages have been set forth in the foregoing description, together with details of structures and functions of critical race control, and the novel features thereof are pointed out in appended claims. The disclosure, however, is illustrative only, and changes may be made in arrangement and details, within the principle of the invention, to the full extent indicated by the broad general meaning of the terms in which the appended claims are expressed.

The objects and advantages of the invention may be further realized and attained by means of the instrumentalities and combinations particularly pointed out in the appended claims. Accordingly, the drawing and description are to be regarded as illustrative in nature, and not as restrictive.

What is claimed is:

1. A method for producing efficient integrated sequential circuits, comprising the steps of:
   providing at least one data input signal and at least one clock signal;
   providing one or more circuit loops each having a plurality of sections and two or more switches wherein said switches in said loops are transmission gates and separate between said sections; and
   adjusting a set of fabrication process parameters affecting said transmission gates, thereby adjusting a relative delay of said sections and controlling a critical race of said loops.

2. The method for producing efficient integrated sequential circuits according to claim 1, wherein each transmission gate is one or more transistors and said relative delay is regulated by adjusting transistor dimensions.

3. The method for producing efficient integrated sequential circuits according to claim 1, wherein each transmission gate is one or more transistors and said relative delay is regulated by adjusting a resistance of said transistors.

4. The method for producing efficient integrated sequential circuits according to claim 1, wherein each transmission gate is one or more transistors and said relative delay is regulated by adjusting a capacitance of said transistors.

5. The method for producing efficient integrated sequential circuits according to claim 1, wherein each transmission gate is one or more transistors and said relative delay is regulated by adjusting a resistance/capacitance (RC) time constant of said transmission gates.

6. The method for producing efficient integrated sequential circuits according to claim 1, wherein said relative delay is adjustable by external parameters.

7. The method for producing efficient integrated sequential circuits according to claim 6, wherein said external parameters include clock frequencies, supply voltages (Vdd), ground supplies (Vss), bias voltages, and temperature.

8. The method for producing efficient integrated sequential circuits according to claim 6, wherein said relative delay is dynamically controllable by said external parameters.

9. The method for producing efficient integrated sequential circuits according to claim 1, wherein a data flow is in a two or more directions.

10. The method for producing efficient integrated sequential circuits according to claim 1, wherein said fabrication process parameters include at least one of doping concentration, implant concentration, threshold voltage, polysilicon dimensions, polysilicon composition, diffusion dimensions, metal dimensions, substrate dimensions, and oxide dimensions.

11. The method for producing efficient integrated sequential circuits according to claim 1, wherein each transmission gate is one or more transistors and further comprising the step of locating said transistors in close proximity.

12. The method for producing efficient integrated sequential circuits according to claim 1, wherein said relative delay is a first propagation delay in a first section as compared to a second propagation delay in a second section, wherein said first and second section are within one of said loops.

13. The method for producing efficient integrated sequential circuits according to claim 1, wherein said relative delay is a first propagation delay in a first section as compared to a second propagation delay in a second section, wherein said first and second sections are coupled.

14. The method for producing efficient integrated sequential circuits according to claim 1, wherein said relative delay is introduced by resistors.

15. The method for producing efficient integrated sequential circuits according to claim 1, wherein said relative delay is introduced by logic circuits.

16. The method for producing efficient integrated sequential circuits according to claim 1, wherein said integrated circuits include at least one of single edge-triggered flip-flops, double edge-triggered flip-flops, D flip-flops, T flip-flops, J-K flip-flops, S-R flip-flops, or binary memory circuit.

17. A sequential circuit comprising:
   a data input;
   a data output;
   a loop with a plurality of sections coupled to said data input and said data output; and
   a means for controlling a critical race by adjusting a relative time delay between said plurality of sections, wherein said means for controlling is adapted for changing at least one of a ratio of a resistance/capacitance (RC) time constant between said sections, and a ratio of resistance associated with said sections.

18. The sequential circuit according to claim 17, further comprising two or more transmission gates and a plurality of logic devices connected in said loop and wherein said relative time delay is a difference in propagation time delay between said sections of said loop.

19. The sequential circuit according to claim 17, wherein said ratio of resistance is of transmission gates of said sections.

20. The sequential circuit according to claim 18, wherein said relative delay is between said logic devices of said sections.

21. The sequential circuit according to claim 18, wherein said relative time difference is changed by adjusting a size of said transmission gates.

22. The sequential circuit according to claim 17, wherein said relative time delay is changed by adjusting a size of capacitance of said sections.

23. A sequential circuit comprising:

a data input;

a first loop with a plurality of first loop sections, wherein said first loop is coupled to said data input;

a second loop with a plurality of second loop sections, wherein said second loop is coupled to said first loop;

an output node coupled to said circuit; and a means for controlling a critical race between said first loop sections and between said second loop sections.

24. The sequential circuit according to claim 23, further comprising two or more transmission gates and a plurality of logic devices connected in each of said first and second loops, wherein a difference in propagation time delay between said sections of said first loop and said sections of said second loop provides a relative time delay.

25. The sequential circuit according to claim 24, wherein said means for controlling is adapted for changing a ratio of resistance of said sections of said first loop and said sections of said second loop.

26. The sequential circuit according to claim 25, wherein said ratio of resistance is between said transmission gates of said sections of said first loop and said transmission gates of said sections of said second loop.

27. The sequential circuit according to claim 23, wherein said means for controlling is adapted for changing a relative time delay in said first loop sections.

28. The sequential circuit according to claim 23, wherein said means for controlling is adapted for changing a relative time delay in said second loop sections.

29. The sequential circuit according to claim 23, wherein said means for controlling is adapted for changing a relative time delay in said first loop sections coupled to said second loop sections.

30. The sequential circuit according to claim 23, wherein said means for controlling is adapted for changing a ratio of a resistance/capacitance (RC) time constant between said first loop sections and said second loop sections.

31. The sequential circuit according to claim 25, wherein said relative time delay is between said logic devices of said sections of said first loop and said logic devices of said sections of said second loop.

32. The sequential circuit according to claim 24, wherein said relative time difference is changed by adjusting a size of said transmission gates.

33. The sequential circuit according to claim 23, wherein a relative time delay between said sections is changed by adjusting a size of capacitances of said sections.

34. A method for producing efficient integrated sequential circuits, comprising the steps of:

providing at least one data input signal and at least one clock signal;

providing one or more circuit loops each having a plurality of sections and two or more switches wherein said switches in said loops are one or more transistors and separate between said sections; and controlling a critical race of said loops by adjusting a relative delay of said sections by adjusting at least one of transistor dimensions, a resistance of said transistors, and a capacitance of said transistors.

35. The method for producing efficient integrated sequential circuits according to claim 34, wherein said relative delay is adjustable by external parameters.

36. The method for producing efficient integrated sequential circuits according to claim 35, wherein said external parameters include clock frequencies, supply voltages (Vdd), ground supplies (Vss), bias voltages, and temperature.

37. The method for producing efficient integrated sequential circuits according to claim 35, wherein said relative delay is dynamically controllable by said external parameters.

38. The method for producing efficient integrated sequential circuits according to claim 34, wherein said switches are transmission gates formed from said one or more transistors, and said relative delay is regulated by adjusting a set of fabrication process parameters affecting said transmission gates.

39. The method for producing efficient integrated sequential circuits according to claim 38, wherein said fabrication process parameters include a least one of doping concentration implant concentration, threshold voltage, polysilicon dimensions, polysilicon composition, diffusion dimensions, metal dimensions, substrate dimensions, and oxide dimensions.

40. The method for producing efficient integrated sequential circuits according to claim 34, further comprising the step of locating said transistors in close proximity.

41. The method for producing efficient integrated sequential circuits according to claim 34, wherein said relative delay is a first propagation delay in a first section as compared to a second propagation delay in a second section, wherein said first and second section are within one of said loops.

42. The method for producing efficient integrated sequential circuits according to claim 34, wherein said relative delay is a first propagation delay in a first section as compared to a second propagation delay in a second section, wherein said first and second sections are coupled.

43. The method for producing efficient integrated sequential circuits according to claim 34, wherein said relative delay is introduced by resistors.

44. The method for producing efficient integrated sequential circuits according to claim 34, wherein said relative delay is introduced by logic circuits.

45. The method for producing efficient integrated sequential circuits according to claim 34, wherein said integrated circuits include at least one of single edge-triggered flip-flops, double edge-triggered flip-flops, D flip-flops, T flip-flops, J-K flip-flops, S-R flip-flops, or binary memory circuit.

46. The method for producing efficient integrated sequential circuits according to claim 34, wherein a data flow is in a two or more directions.

47. The method for producing efficient integrated sequential circuits according to claim 34, wherein said switches are transmission gates formed from said one or more transistors, and said relative delay is regulated by adjusting a resistance/capacitance (RC) time constant of said transmission gates.

* * * * *

UNITED STATES PATENT AND TRADEMARK OFFICE
CERTIFICATE OF CORRECTION

PATENT NO. : 6,621,302 B2
DATED : September 16, 2003
INVENTOR(S) : Menahem Lowy, Neal R. Butler and Rosanne Tinkler It is certified that error appears in the above-identified patent and that said Letters Patent is hereby corrected as shown below:

Title page,
Item [73], Assignee, delete "Bae", insert -- BAE --

Column 10,
Line 36, delete "GI", insert -- G1 --

Column 11,
Line 30, delete "0", insert -- Q --

Column 12,
Line 38, delete ",", insert -- . --

Column 24,
Lines 28-29, delete "concentration implant", insert -- concentration, implant --

Signed and Sealed this

Second Day of November, 2004

JON W. DUDAS
*Director of the United States Patent and Trademark Office*